US012672376B2

(12) United States Patent
Shinohara

(10) Patent No.: US 12,672,376 B2
(45) Date of Patent: Jun. 30, 2026

(54) IMAGE SENSOR INCLUDING A REGION SEPARATION PATTERN

(71) Applicant: SAMSUNG ELECTRONICS CO., LTD., Suwon-si (KR)

(72) Inventor: Takekazu Shinohara, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 70 days.

(21) Appl. No.: 17/518,919

(22) Filed: Nov. 4, 2021

(65) Prior Publication Data

US 2022/0238569 A1 Jul. 28, 2022

(30) Foreign Application Priority Data

Jan. 28, 2021 (KR) ........................ 10-2021-0012000

(51) Int. Cl.
*H10F 39/00* (2025.01)

(52) U.S. Cl.
CPC ....... *H10F 39/807* (2025.01); *H10F 39/8053* (2025.01); *H10F 39/8063* (2025.01); *H10F 39/811* (2025.01)

(58) Field of Classification Search
CPC ... H01L 27/144–14893; H01L 27/1463; H01L 27/14621; H01L 27/14627; H01L 27/14636; H01L 27/146; H01L 27/14601; H10F 39/807
See application file for complete search history.

(56) References Cited

U.S. PATENT DOCUMENTS

| | | | |
|---|---|---|---|
| 9,608,024 | B2 | 3/2017 | Lee et al. |
| 9,711,553 | B2 | 7/2017 | Kim et al. |
| 9,911,777 | B2 | 3/2018 | Lee et al. |
| 10,157,948 | B2 | 12/2018 | Lee et al. |
| 10,461,109 | B2 | 10/2019 | Wu et al. |

(Continued)

FOREIGN PATENT DOCUMENTS

| | | |
|---|---|---|
| KR | 10-2018-0065169 A | 6/2018 |
| KR | 10-2020-0014722 A | 2/2020 |

(Continued)

OTHER PUBLICATIONS

Office Action dated May 22, 2025 issued in the corresponding Korean Patent Application No. 10-2021-0012000.

*Primary Examiner* — Kretelia Graham
*Assistant Examiner* — Adin Hrnjic
(74) *Attorney, Agent, or Firm* — MORGAN, LEWIS & BOCKIUS LLP

(57) ABSTRACT

An image sensor includes a substrate. A pixel separation pattern defines a plurality of unit pixels inside the substrate. A first photoelectric conversion unit and a second photoelectric conversion unit are arranged inside each of the plurality of unit pixels in a first direction. A plurality of microlenses is disposed on the substrate to correspond to each of the plurality of unit pixels. A region separation pattern is disposed in the substrate between the first photoelectric conversion unit and the second photoelectric conversion unit. The region separation pattern extends in a second direction intersecting the first direction, is directly connected to the pixel separation pattern, and has a zigzag shape or a wavy shape in a plan view.

19 Claims, 17 Drawing Sheets

(56)  References Cited

U.S. PATENT DOCUMENTS

| | | | |
|---|---|---|---|
| 10,658,411 B2 | 5/2020 | Pyo et al. | |
| 10,804,307 B2 | 10/2020 | Cheng et al. | |
| 11,302,735 B2 * | 4/2022 | Yang ................. | H01L 27/14625 |
| 2018/0158864 A1 * | 6/2018 | Kim .................. | H01L 27/14831 |
| 2018/0204961 A1 * | 7/2018 | Lee ................... | H01L 27/14685 |
| 2020/0235148 A1 | 7/2020 | Shim | |
| 2020/0235149 A1 * | 7/2020 | Shiraishi ........... | H01L 27/14612 |
| 2021/0167104 A1 * | 6/2021 | Rao .................. | H01L 27/14614 |
| 2021/0183928 A1 * | 6/2021 | Hoshi ............... | H01L 27/14627 |
| 2022/0140156 A1 * | 5/2022 | Yagi ..................... | G01S 7/4863 |
| | | | 356/5.01 |

FOREIGN PATENT DOCUMENTS

| | | | |
|---|---|---|---|
| WO | 2018139279 | 8/2018 | |
| WO | 2019/093135 A1 | 5/2019 | |

* cited by examiner

IMAGE SENSOR INCLUDING A REGION SEPARATION PATTERN

CROSS-REFERENCE TO RELATED APPLICATION

This application claims priority under 35 U.S.C. § 119 to Korean Patent Application No. 10-2021-0012000, filed on Jan. 28, 2021 in the Korean Intellectual Property Office, the disclosure of which is incorporated by reference in its entirety herein.

TECHNICAL FIELD

The present inventive concepts relate to an image sensor.

DISCUSSION OF RELATED ART

An image sensor is a semiconductor element that converts optical information into an electric signal. Examples of image sensors may include a charge coupled device (CCD) image sensor and a complementary metal-oxide semiconductor (CMOS) image sensor.

As the resolution of the CMOS image sensor increases, the number of pixels implemented in a pixel array of the CMOS image sensor increases. Since numerous pixels are implemented in the pixel array which has a limited size, the size of each pixel may decrease as the number of pixels increase. Accordingly, an interference phenomenon between the pixels, such as a crosstalk, may occur.

SUMMARY

Aspects of the present inventive concepts provide an image sensor that prevents or reduces a crosstalk between adjacent unit pixels.

Aspects of the present inventive concepts also provide an image sensor that reduces an occurrence of noise difference depending on positions of adjacent unit pixels.

Aspects of the present inventive concepts also provide a method for fabricating a semiconductor package having increased product reliability.

According to an embodiment of the present inventive concepts, an image sensor includes a substrate. A pixel separation pattern defines a plurality of unit pixels inside the substrate. A first photoelectric conversion unit and a second photoelectric conversion unit are arranged inside each of the plurality of unit pixels in a first direction. A plurality of microlenses is disposed on the substrate to correspond to each of the plurality of unit pixels. A region separation pattern is disposed in the substrate between the first photoelectric conversion unit and the second photoelectric conversion unit. The region separation pattern extends in a second direction intersecting the first direction, is directly connected to the pixel separation pattern, and has a zigzag shape or a wavy shape in a plan view.

According to an embodiment of the present inventive concepts, an image sensor includes a substrate. A pixel separation pattern defines a plurality of unit pixels inside the substrate. A first photoelectric conversion unit and a second photoelectric conversion unit are arranged inside each of the plurality of unit pixels in a first direction. A plurality of microlenses is disposed on the substrate to correspond to each of the plurality of unit pixels. A region separation pattern extends in a second direction intersecting the first direction, is directly connected to the pixel separation pattern, and is disposed in the substrate between the first photoelectric conversion unit and the second photoelectric conversion unit. In a plan view, a side wall of the region separation pattern has one of a first shape including at least two straight lines inclined at different angles on a basis of a center line parallel to the second direction, and a second shape including at least one concave curve in the first direction and at least one convex curve in the first direction.

According to an embodiment of the present inventive concepts, an image sensor includes a substrate that includes a first surface on which light is incident, and a second surface opposite to the first surface in a vertical direction. A unit pixel is inside the substrate. A color filter is disposed on the first surface of the substrate, and overlaps the unit pixel in the vertical direction. A pixel separation pattern surrounds the unit pixel. A first photoelectric conversion unit and a second photoelectric conversion unit are arranged inside the unit pixel in a first direction intersecting the vertical direction. A microlens is disposed on the color filter to correspond to the unit pixel. A region separation pattern extends in a second direction intersecting the first direction, is directly connected to the pixel separation pattern, and is disposed between the first photoelectric conversion unit and the second photoelectric conversion unit inside the substrate. An electronic element is disposed on the second surface of the substrate. A wiring structure is disposed on the second surface of the substrate, and includes a wiring insulating film that covers the electronic element, and a plurality of wirings in the wiring insulating film. In a plan view, a side wall of the region separation pattern has one of a first shape including at least two straight lines inclined at different angles on a basis of a center line parallel to the second direction, and a second shape including at least one concave curve in the first direction and at least one convex curve in the first direction.

However, aspects of the present inventive concepts are not limited to the ones set forth herein. The above and other aspects of the present inventive concepts will become more apparent to one of ordinary skill in the art to which the present inventive concepts pertain by referencing the detailed description of embodiments given below.

BRIEF DESCRIPTION OF THE DRAWINGS

The above and other aspects and features of the present inventive concepts will become more apparent by describing in detail embodiments thereof referring to the attached drawings, in which:

FIG. 3 is a layout diagram of a unit pixel of an image sensor according to an embodiment of the present inventive concepts;

DETAILED DESCRIPTION OF EMBODIMENTS

Figure 1:
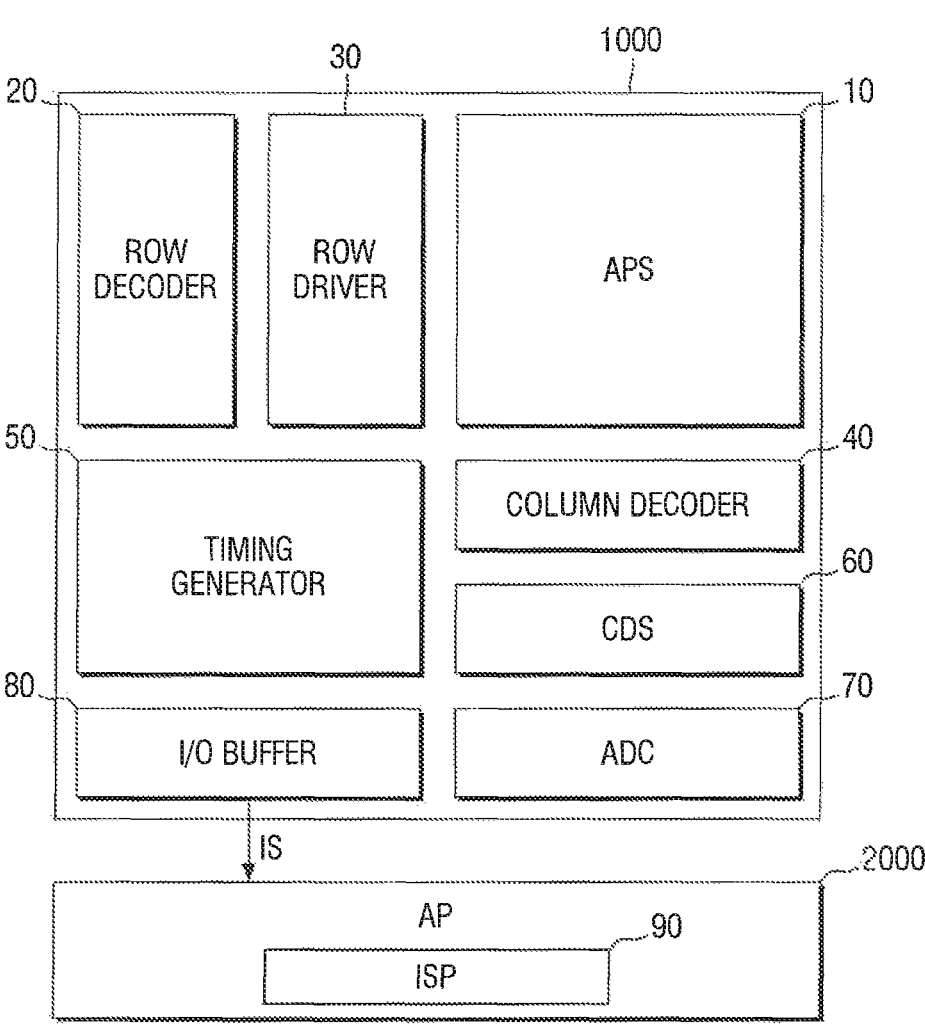
FIG. 1 is a block diagram of an image processing device according to an embodiment of the present inventive concepts.

FIG. 1 is a block diagram for explaining an image processing device according to an embodiment of the present inventive concepts.

Referring to FIG. 1, the image processing device according to some embodiments may include an image sensor 1000 and an application processor 2000.

The image processing device may be applied to an electronic device that acquires an external image, such as a smart phone or a digital camera. However, embodiments of the present inventive concepts are not limited thereto.

The image sensor 1000 may convert an optical signal, which is provided from outside, into an electrical signal. In an embodiment, the image sensor 1000 may include a plurality of unit pixels. Each unit pixel of the image sensor 1000 may, for example, receive light reflected from an external object, and convert the received light into an electrical image signal or a photographic signal.

The image sensor 1000 includes an active pixel sensor array (APS) 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 includes a plurality of unit pixels arranged two-dimensionally, and may convert an optical signal into an electric signal. The active pixel sensor array 10 may be driven by a plurality of drive signals, such as pixel selection signal, reset signal, and charge transfer signals, from the row driver 30. Also, the electrical signal converted by the active pixel sensor array 10 may be provided to the correlated double sampler 60.

In an embodiment, the row driver 30 may provide a large number of drive signals for driving a plurality of unit pixels to the active pixel sensor array 10 according to the results decoded by the row decoder 20. When the unit pixels are arranged in a matrix form, the drive signals may be provided for each row.

In an embodiment, the timing generator 50 may provide a timing signal and a control signal to the row decoder 20 and the column decoder 40.

The correlated double sampler (CDS) 60 may receive, hold and sample the electrical signals generated by the active pixel sensor array 10. In an embodiment, the correlated double sampler 60 may doubly sample a specific noise level and the signal level due to an electrical signal, and output a difference level corresponding to a difference between the noise level and the signal level.

The analog-to-digital converter (ADC) 70 may convert the analog signal corresponding to the difference level, which is output from the correlated double sampler 60, into a digital signal and output the digital signal.

The I/O buffer 80 latches the digital signal, and the latched signal may be sequentially output to the application processor 2000 according to the decoding result from the column decoder 40. The latched signal may be, for example, an image signal IS.

The image signal IS may be provided to the application processor 2000 and processed. For example, the image signal IS may be provided to the image signal processor 90 included in the application processor 2000. The image signal processor 90 may then process or treat the image signal IS to be easily displayed.

In an embodiments, the image sensor 1000 and application processor 2000 may be separately arranged as shown. For example, in an embodiment, the image sensor 1000 is mounted on the first chip and an application processor 2000 is mounted on the second chip to communicate with each other through an interface. However, embodiments of the present inventive concepts are not limited thereto. For example, in an embodiment, the image sensor 1000 and the application processor 2000 may be implemented as a single package, for example, a multi chip package (MCP).

Figure 2:
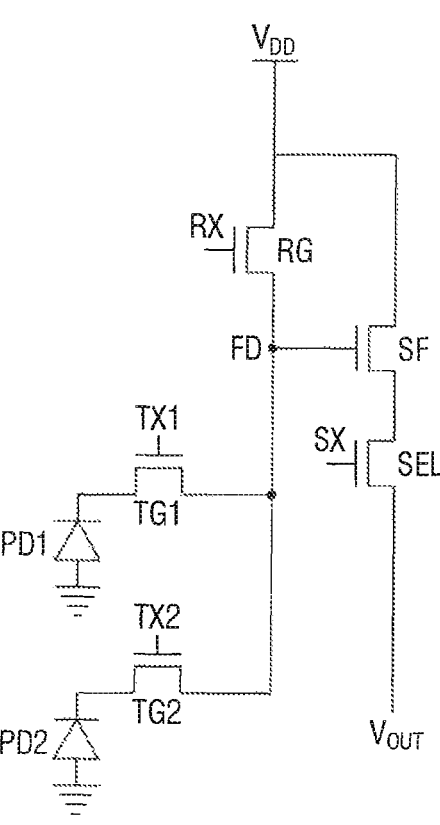
FIG. 2 is a circuit diagram of a unit pixel of an image sensor according to an embodiment of the present inventive concepts.

FIG. 2 is an circuit diagram for explaining a unit pixel of an image sensor according to an embodiment of the present inventive concepts.

Referring to FIG. 2, in the image sensor according to some embodiments, the unit pixel may include a first photoelectric conversion unit PD1, a second photoelectric conversion unit PD2, a first transfer transistor TG1, a second transfer transistor RG2, a floating diffusion region FD, a reset transistor RG, a source follower transistor SF, and a selection transistor SEL.

The first photoelectric conversion unit PD1 and the second photoelectric conversion unit PD2 may each generate electric charges in proportion to the amount of light incident from the outside. As shown in the embodiment of FIG. 2, the first photoelectric conversion unit PD1 may be coupled with the first transfer transistor TG1. The second photoelectric conversion unit PD2 may be coupled with the second transfer transistor TG2.

Since a floating diffusion region FD is a region that converts electric charge into voltage, and has a parasitic capacitance, the electric charge may be accumulatively stored. In an embodiment, the first transfer transistor TG1 is driven by a first transmission line that applies a predetermined bias (e.g., a first transmission signal TX1), and may transmit the charge generated from the first photoelectric conversion unit PD1 to the floating diffusion region FD. The second transfer transistor TG2 is driven by a second transmission line that applies a predetermined bias (e.g., a second transmission signal TX2), and may transmit the charge generated from the second photoelectric converter PD2 to the floating diffusion region FD.

In the image sensor according to some embodiments, the first transfer transistor TG1 and the second transfer transistor TG2 may share the floating diffusion region FD. For example, a first end of the first transfer transistor TG1 may be connected to the first photoelectric conversion unit PD1, and a second end of the first transfer transistor TG1 may be connected to the floating diffusion region FD. A first end of the second transfer transistor TG2 may be connected to the second photoelectric conversion unit PD2, and a second end of the second transfer transistor TG2 may be connected to the floating diffusion region FD.

The source follower transistor SF may amplify a change in the electrical potential of the floating diffusion region FD to which the electric charge is transferred from the first photoelectric conversion element PD1, and may output it to an output line $V_{OUT}$. When the source follower transistor SF is turned on, a predetermined electrical potential provided to a drain of the source follower transistor SF, for example, a power voltage $V_{DD}$, may be transferred to a drain region of the selection transistor SEL.

In an embodiment, the selection transistor SEL may select a unit pixel to be read on a row basis. The selection transistor SEL may be made up of a transistor that is driven by a selection line that applies a predetermined bias (e.g., a row selection signal SX).

The reset transistor RG may periodically reset the floating diffusion region FD. In an embodiment, the reset transistor RG may be driven by a reset line that applies a predetermined bias (e.g., a reset signal RX). When the reset transistor RG is turned on by the reset signal RX, a predetermined electrical potential provided to the drain of the reset transistor RG, for example, the power voltage $V_{DD}$, may be transferred to the floating diffusion region FD.

Figure 3:
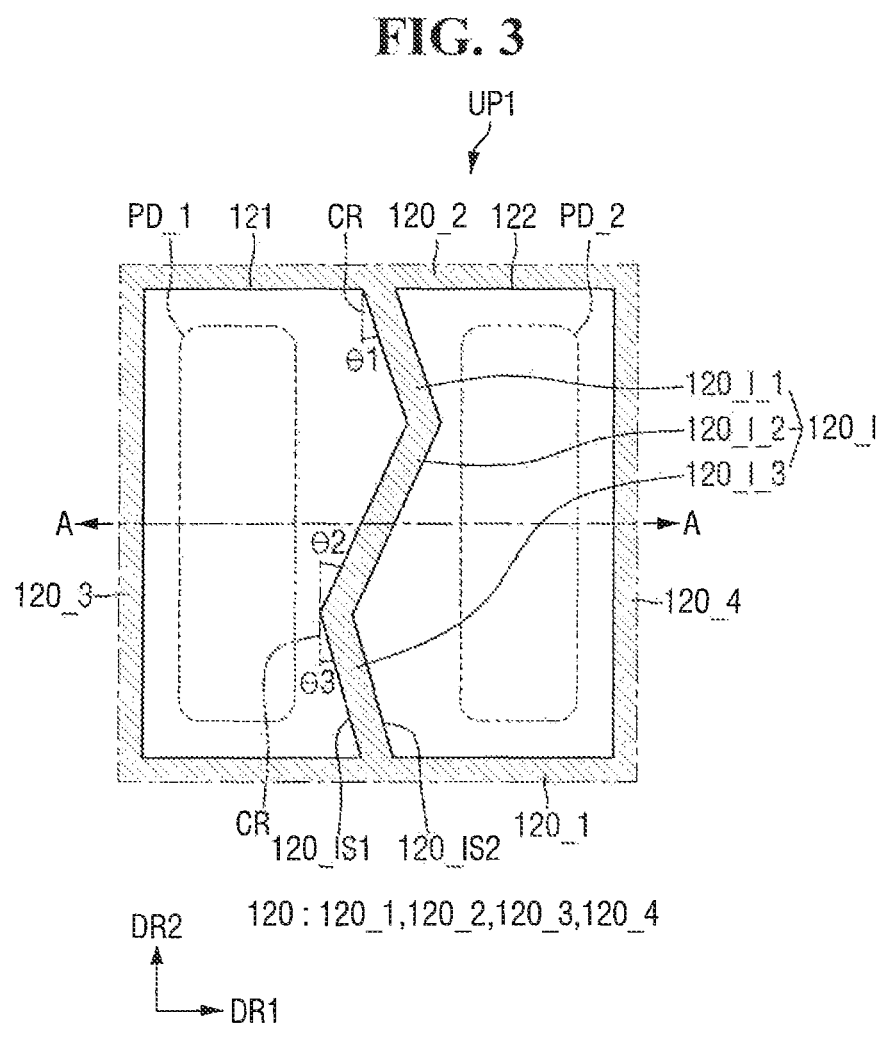
Figure 4:
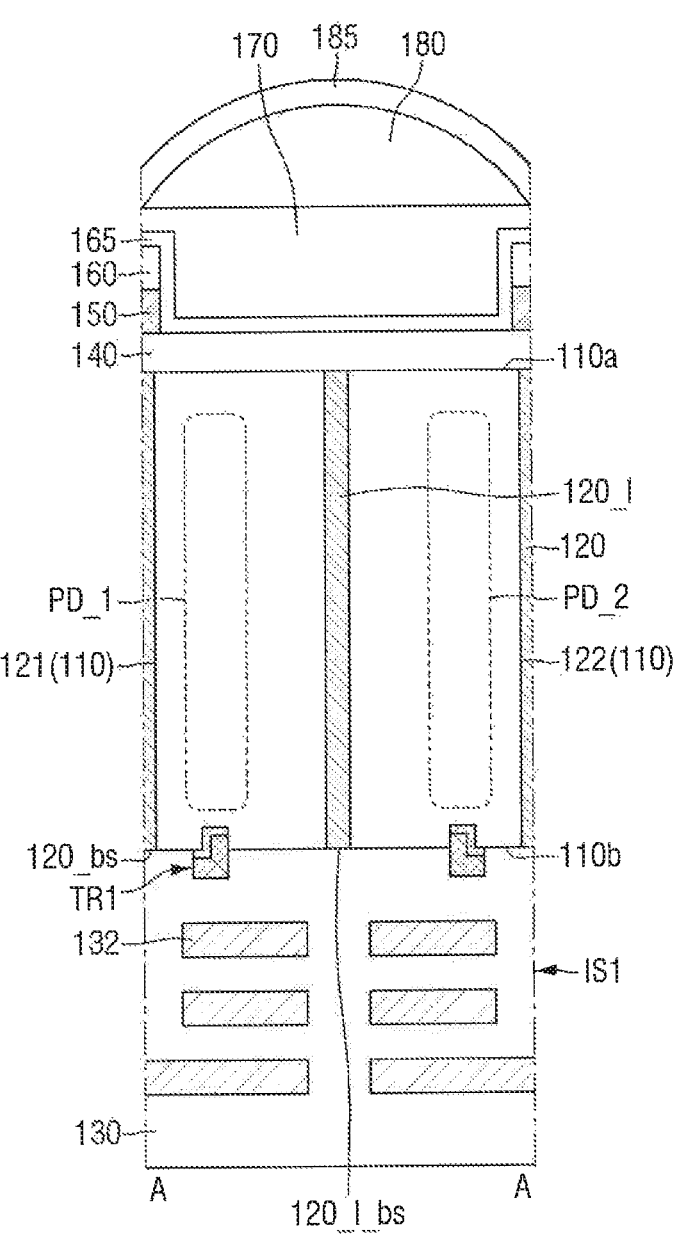
FIGS. 4 to 6 are cross-sectional views taken along line A-A of FIG. 3 according to an embodiment of the present inventive concepts.
Figure 5:
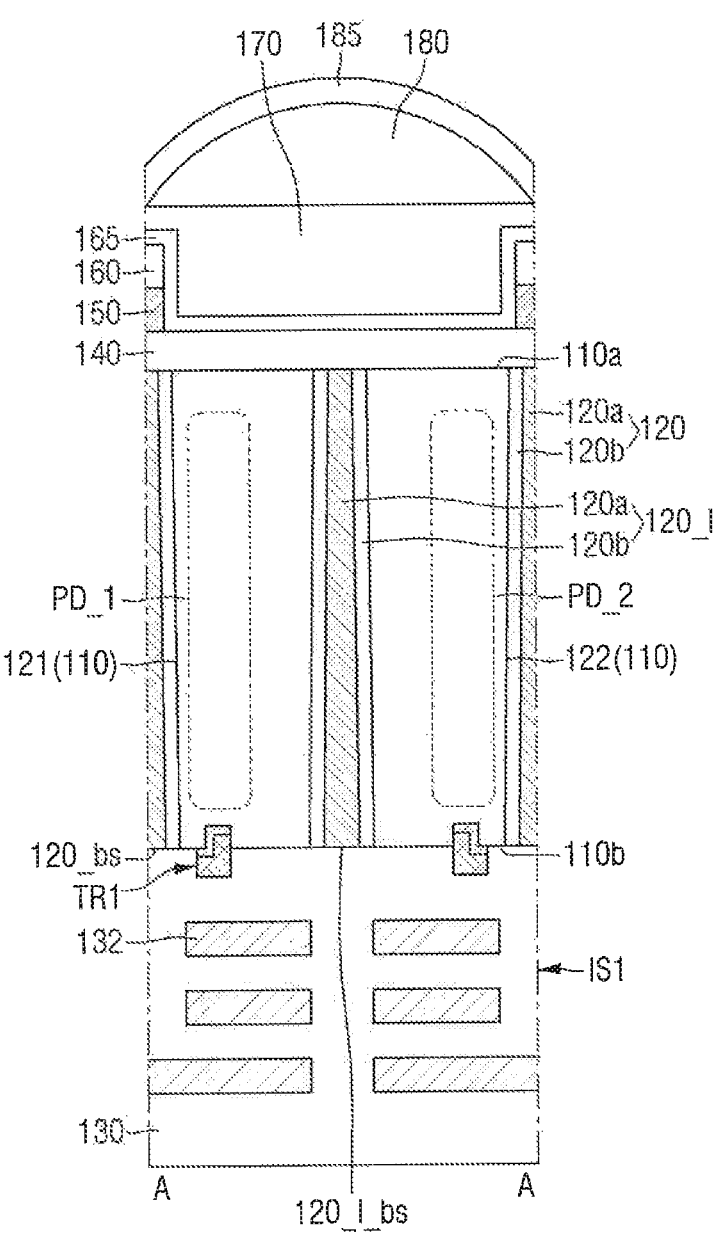
Figure 6:
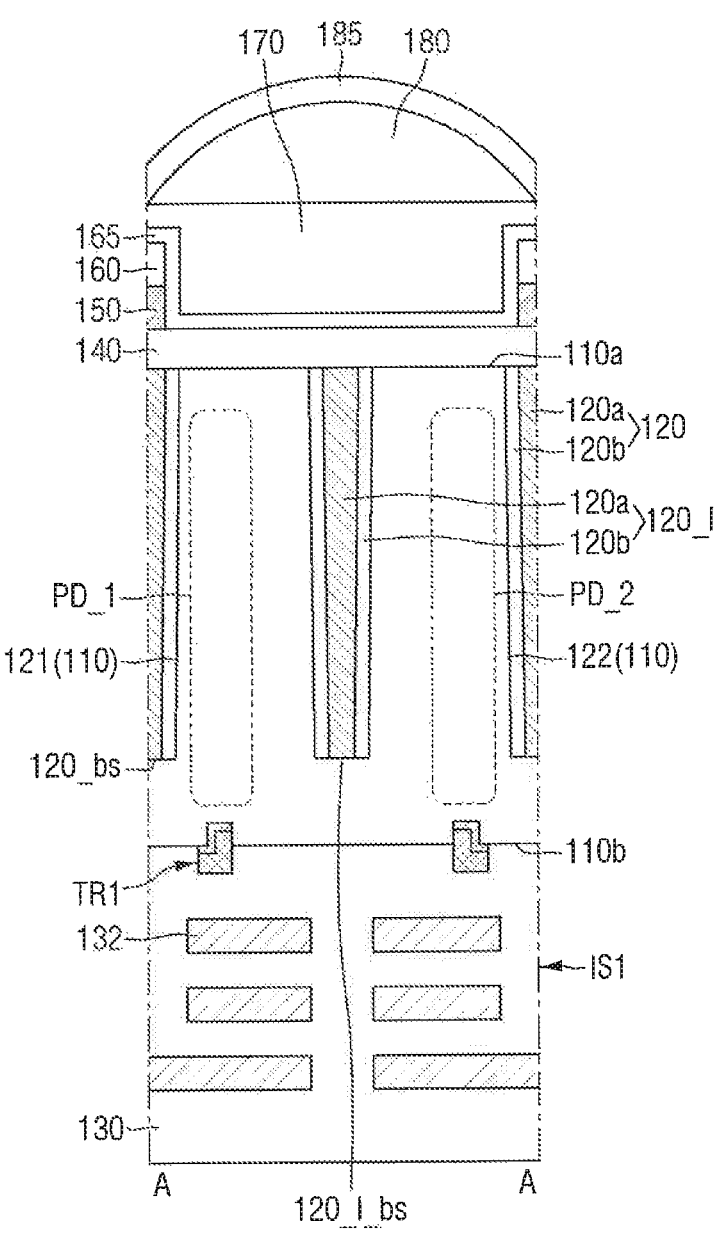

FIG. 3 is a layout diagram for explaining a unit pixel of an image sensor according to an embodiment of the present inventive concepts. FIGS. 4 to 6 are cross-sectional views taken along line A-A of FIG. 3 according to embodiments of the present inventive concepts.

Referring to FIGS. 3 and 4, a unit pixel UP1 of the image sensor according to some embodiments may include a first substrate 110, a pixel separation pattern 120, a region separation pattern 120_I, a first wiring structure IS1, a surface insulating film 140, a color filter 170, and a microlens 180.

In an embodiment, the first substrate 110 may be a semiconductor substrate. For example, the first substrate 110 may be bulk silicon or SOI (silicon-on-insulator). The first substrate 110 may be a silicon substrate or may include other materials, for example, silicon germanium, indium antimonide, lead tellurium compounds, indium arsenic, indium phosphide, gallium arsenide or gallium antimonide. Alternatively, the first substrate 110 may have an epitaxial layer formed on a base substrate. However, embodiments of the present inventive concepts are not limited thereto.

The first substrate 110 may include a first surface 110a and a second surface 110b that are opposite to each other (e.g., in a vertical direction). In embodiments to be described below, the first surface 1.10a may be referred to as a back side of the first substrate 110, and the second surface 110b may be referred to as a front side of the first substrate 110. In some embodiments, the first surface 110a of the first substrate 110 may be a light-receiving surface on which light is incident. For example, the image sensor according to some embodiments may be a back side illumination (BSI) image sensor.

The first substrate 110 may include, for example, impurities of a first conductive type. In the following embodiments, although the first conductive type will be described as being a p-type, this is merely an example, and the first conductive type may, of course, be an n-type.

A plurality of unit pixels may be formed on the first substrate 110. The plurality of unit pixels may be arranged in two dimensions (e.g., in the form of a matrix) in a plane including, for example, a first direction DR1 and a second direction DR2. For convenience of explanation, one unit pixel (e.g., a first unit pixel UP1) formed in the first substrate 110 will be mainly described below.

The pixel separation pattern 120 may be formed inside the first substrate 110. The pixel separation pattern 120 may define a plurality of unit pixels in the first substrate 110. For example, as shown in the embodiments of FIGS. 3-4, the pixel separation pattern 120 may include a first pixel separation pattern 120_1 and a second pixel separation pattern 120_2 that extend longitudinally in the first direction DR1 and are opposite to each other in the second direction DR2, and a third pixel separation pattern 120_3 and a fourth pixel separation pattern 120_4 that extend longitudinally in the second direction DR2 and are opposite to each other the first direction DR1. The first pixel separation pattern 120_1 and the second pixel separation pattern 120_2 may each be connected to the third pixel separation pattern 120_3 and the fourth pixel separation pattern 120_4. For example, the pixel separation pattern 120 may surround the first unit pixel UP1 (e.g., in the first and second directions DR1, DR2).

In the image sensor according to some embodiments, in a plan view in a plane defined in the first direction DR1 and the second direction DR2, a portion of a region separation pattern 120_I directly connected to the first pixel separation pattern 120_1 may at least partially overlap a portion of a region separation pattern 120_I directly connected to the second pixel separation pattern 120_2 in the second direction DR2. Hereinafter, in the plan view means in a plane defined in the first direction DR1 and the second direction DR2.

In the image sensor according to some embodiments, the pixel separation pattern 120 may extend from the second surface 110b to the first surface 110a of the first substrate 110. For example, the pixel separation pattern 120 may be formed by burying an insulating material inside a deep trench formed in the first substrate 110.

In an embodiment, the pixel separation pattern 120 may include, but is not limited to, for example, at least one compound selected from silicon oxide, silicon nitride, silicon oxynitride, aluminum oxide, hafnium oxide, and a combination thereof.

The first unit pixel UP1 may include a first photoelectric conversion unit PD_1 and a second photoelectric conversion unit PD_2. The first photoelectric conversion unit PD_1 and the second photoelectric conversion unit PD_2 may be disposed in the first substrate 110 of the first unit pixel UP1. For example, the first photoelectric conversion unit PD_1 and the second photoelectric conversion unit PD_2 may be arranged inside the first unit pixel UP1 in the first direction DR1.

In an embodiment, the first photoelectric conversion unit PD_1 may correspond to the first photoelectric conversion unit PD1 of FIG. 2, and the second photoelectric conversion unit PD_2 may correspond to the second photoelectric conversion unit PD2 of FIG. 2. The first photoelectric conversion unit PD_1 and the second photoelectric conversion unit PD_2 may generate an electric charge in proportion to the amount of light incident from the outside.

The first photoelectric conversion unit PD_1 and the second photoelectric conversion unit PD_2 may include impurities of a second conductive type. The second conductive type may be different from the first conductive type. In the following examples, although the second conductive type will be described as being an n-type, this is merely an example, and the second conductive type may be a p-type in some embodiments.

In an embodiment, the first photoelectric conversion unit PD_1 and the second photoelectric conversion unit PD_2 may be formed by, for example, ion implantation of the n-type impurities (e.g., phosphorus (P) or arsenic (As)) into the p-type first substrate 110. However, embodiments of the present inventive concepts are not limited thereto.

In the image sensor according to some embodiments, the first unit pixel UP1 may perform the function of auto focus (AF). For example, since the first unit pixel UP1 may include two photoelectric conversion units e.g., a first photoelectric conversion unit PD_1 and a second photoelectric conversion unit PD_1), the auto focus function may be performed, using a phase detection AF (PDAF).

The first unit pixel UP1 may include a region separation pattern 120_I disposed between the first photoelectric conversion unit PD_1 and the second photoelectric conversion unit PD_2. The region separation pattern 120_I may be disposed inside the first substrate 110 of the first unit pixel UP1.

In the image sensor according to some embodiments, the region separation pattern 120_I may be connected to the pixel separation pattern 120. For example, as shown in the embodiment of FIG. 3, the region separation pattern 120_I extends in the second direction DR2 that intersects the first direction DR1, and may be directly connected to the first pixel separation pattern 120_1 and the second pixel separation pattern 120_2. Accordingly, the first unit pixel UP1 may include a first region 121 and a second region 122 that are separated by the region separation pattern 120_I. The first region 121 may include a first photoelectric conversion unit PD_1, and the second region 122 may include a second photoelectric conversion unit PD_2. While the embodiment of FIG. 3 includes two regions, in some embodiments a unit pixel may include three or more regions and have two or more separation patterns.

The region separation pattern 120_I may include a first side wall 120_IS1 and a second side wall 120_IS2 that are opposite to each other. The first side wall 120_IS1 may define at least a portion of the first region 121, and the second side wall 120_IS2 may define at least a portion of the second region 122. The first side wall 120_IS1 may be adjacent to the first photoelectric conversion unit PD_1 (e.g., in the first direction DR1), and the second side wall 120_IS2 may be adjacent to the second photoelectric conversion unit PD_2 (e.g., in the first direction DR1). In an embodiment, the first side wall 120_IS1 of the region separation pattern may be parallel to the second side wall 120_IS2 of the region separation pattern. In an embodiment, a thickness of the region separation pattern 120_I in the first direction DR1 may be substantially the same.

In the image sensor according to some embodiments, the region separation pattern 120_I may have a zigzag shape in the plan view. For example, the first and second side walls 120_IS1 and 120_IS2 of the region separation pattern 120_I may have a shape that includes at least two or more straight lines that incline at different angles on the basis of a center line CL parallel to the second direction DR2 in the plan view.

For example, as shown in the embodiment of FIG. 3, the region separation pattern 120_I may include a first portion 120_I_1 that inclines at a first angle θ1, a second portion 120_I_2 that inclines at a second angle θ2, and a third portion 120_I_3 that inclines at a third angle θ3, on the basis of the center line CL. Here the center line CL may be parallel to the second direction DR2. For example, each of the first and second side walls 120_IS1 and 120_IS2 of the region separation pattern 120_I may include a first straight line that inclines at the first angle θ1, a second straight line that inclines at the second angle θ2, and a third straight line that inclines at the third angle θ3, on the basis of the center line CL.

For example, the first angle θ1, the second angle θ2, and the third angle θ3 may be different from each other. However, embodiments of the present inventive concepts are not limited thereto. For example, in another embodiment, any one of the first angle θ1, the second angle θ2 and the third angle θ3 may be the same as the other thereof.

The light that is incident on the first unit pixel UP1 may be diffusely reflected by the region separation pattern 120_I, and diffusely reflected light may be incident on the unit pixels adjacent in the first direction DR1 and the unit pixels adjacent in the second direction DR2. As a result, crosstalk may occur between the first unit pixel UP1 and the unit pixels adjacent to the first unit pixel UP1.

Further, when the region separation pattern 120_I has a straight line shape in the plan view, an amount of diffusely reflected light incident on the unit pixel adjacent to the first unit pixel UP1 in the first direction DR1 may be different from an amount of diffusely reflected light incident on the unit pixel adjacent to the first unit pixel UP1 in the second direction DR2. Therefore, crosstalk that occurs in the unit pixel adjacent to the first unit pixel UP1 in the first direction DR1 may be greater than crosstalk that occurs in the unit pixel adjacent to the first unit pixel UP1 in the second direction DR2.

However, since the region separation pattern 120_I has a zigzag shape in the image sensor according to some embodiments, the light reflected by the region separation pattern 120_I may be dispersed. As a result, a difference between crosstalk that occurs in the unit pixel adjacent to the first unit pixel UP1 in the first direction DR1 and crosstalk that occurs in the unit pixel adjacent to the first unit pixel UP1 in the second direction DR2 may be reduced. Therefore, an occurrence of noise difference depending on the positions of the unit pixel adjacent to the first unit pixel UP1 may be reduced or prevented.

Further, in the image sensor according to some embodiments in which the first substrate 110 includes silicon and the region separation pattern 120_I includes silicon oxide, at least one of the first angle θ1, the second angle θ2 and the third angle θ3 may be in a range of about 11 degrees or more. For example, when the first angle θ1 is in a range of about 11 degrees or more, the light reflected by the first portion 120_I_1 may be incident on the fourth pixel separation pattern 120_4 at an angle that is twice the first angle θ1, such as about 22 degrees or more. Accordingly, the light incident on the fourth pixel separation pattern 120_4 may be totally reflected. For example, the light reflected by the region separation pattern 120_I to the first to fourth pixel separation patterns 120_1, 120_2, 120_3, and 120_4 may be totally reflected. Therefore, it is possible to prevent or reduce crosstalk between the first unit pixel UP1 and the unit pixels adjacent to the first unit pixel UP1.

In the image sensor according to an embodiment of the present inventive concepts, the region separation pattern 120_I extends from the second surface 110b of the first substrate 110 to the first surface 110a of the first substrate 110. For example, in an embodiment, the region separation pattern 120_I may be formed by burying an insulating material inside a deep trench formed in the first substrate 110. A bottom surface 120_I_bs of the region separation pattern 120_I may be disposed on substantially the same plane as a bottom surface 120_bs of the pixel separation pattern 120. For example, the bottom surface 120_I_bs of the region separation pattern 120_I may be coplanar in a vertical direction with the bottom surface 120_bs of the pixel separation pattern 120. The bottom surface of the region separation pattern 120_I and the bottom surface 120_bs of the pixel separation pattern 120 may be disposed on the second surface 110b of the first substrate 110. Therefore, the first region 121 and the second region 122 may be completely separated.

The first unit pixel UP1 may include a first electronic element TR1. In an embodiment, the first electronic element TR1 may be disposed, for example, on the second surface 110*b* of the first substrate 110. The first electronic element TR1 may be connected to the first photoelectric conversion unit PD_1 and/or the second photoelectric conversion unit PD_2 to form various transistors for processing the electric signal. For example, the first electronic element TR1 may be a first transfer transistor TG1, a second transfer transistor TG2, a reset transistor RG, a source follower transistor SF or a selection transistor SEL of FIG. 2.

In some embodiments, the first electronic element TR1 may include a vertical transfer transistor. For example, at least a portion of the first electronic element TR1 constituting the first transfer transistor TG1 and/or the second transmission transistor TG2 may extend into the first substrate 110. For example, the first transfer transistor TG1 and/or the second transmit transistor TG2 may include a vertical transfer gate that is at least partially buried inside the first substrate 110. The first electronic element TR1 having such a form may reduce the area of a unit pixel, which may be advantageous for high integration of an image sensor.

The first wiring structure IS1 may be disposed on the first substrate 110. The first wiring structure IS1 may be disposed, for example, on the second surface 110*b* of the first substrate 110. Further, the first wiring structure IS1 may cover, for example, the second surface 110*b* of the first substrate 110.

The first wiring structure IS1 may be made up of one or more wirings. For example, the first wiring structure IS1 may include a first wiring insulating film 130, and a plurality of first wirings 132 in the first wiring insulating film 130. While the embodiment of FIG. 4 shows three layers of wiring, embodiments of the present inventive concepts are not limited thereto and the number of layers of wiring constituting the first wiring structure IS1 and the arrangement thereof may vary.

The first wiring 132 may be electrically connected to the first unit pixel UP1. For example, the first wiring 132 may be connected to the first electronic element TR1.

In an embodiment, the first wiring insulating film 130 may include, but is not limited to, for example, at least one compound selected from silicon oxide, silicon nitride, silicon oxynitride, and a low dielectric constant (low-k) material having a lower dielectric constant than silicon oxide. The first wiring insulating film 130 may cover the first electronic element TR1.

The surface insulating film 140 may be disposed on (e.g., directly thereon) the first surface 110*a* of the first substrate 110. The surface insulating film 140 may extend along the first surface 110*a* of the first substrate 110. The surface insulating film 140 may include an insulating material. For example, the surface insulating film 140 may include, but is not limited to, at least one compound selected from silicon oxide, silicon nitride, silicon oxynitride, aluminum oxide, hafnium oxide, and a combination thereof.

While the embodiment of FIG. 4 shows the surface insulating film 140 formed of a single film, embodiments of the present inventive concepts are not limited thereto. For example, in an embodiment, the surface insulating film 140 may be formed of multi-films. For example, in an embodiment, the surface insulating film 140 may include, but is not limited to, an aluminum oxide film, a hafnium oxide film, a silicon oxide film, a silicon nitride film and a hafnium oxide which are sequentially stacked on the first surface 110*a* of the first substrate 110.

The surface insulating film 140 may function as an antireflection film to prevent reflection of light incident on the first substrate 110, thereby increasing the light-receiving rate of the first photoelectric conversion unit PD_1 and the second photoelectric conversion unit PD_2. Further, the surface insulating film 140 may function as a flattening film to form the color filter 170 and the microlens 180 at a uniform height.

The color filter 170 may be disposed on the surface insulating film 140. In an embodiment, the color filter 170 may be arranged to correspond to the first unit pixel UP1. The color filter 170 may be arranged two-dimensionally (e.g., in the form of a matrix) to correspond to a plurality of unit pixels in a plane including the first direction DR1 and the second direction DR2.

The color filter 170 may have various colors depending on the unit pixel. For example, the color filter 170 may be arranged in the form of a bayer pattern that includes a red color filter, a green color filter, and a blue color filter. However, embodiments of the present inventive concepts are not limited thereto. For example, in some embodiments, the color filter 170 may include a yellow filter, a magenta filter, and a cyan filter, and may also further include a white filter.

Grid patterns may be firmed between the color filters 170. The grid patterns may be formed on the surface insulating film 140. The grid patterns are formed in a grid pattern in the plan view, and may be interposed between the color filters 170. In some embodiments, the grid patterns may be disposed to overlap the pixel separation pattern 120 in the vertical direction.

As shown in the embodiment of FIG. 4, the grid patterns may include a conductive pattern 150 and a low refractive index pattern 160. The conductive pattern 150 and the low refractive index pattern 160 may be sequentially stacked on, for example, the surface insulating film 140.

The conductive pattern 150 may include a conductive material. For example, the conductive pattern 150 may include, hut is not limited to, at least one compound selected from titanium (Ti), titanium nitride (TiN), tantalum (Ta), tantalum nitride (TaN), tungsten (W), aluminum (Al), copper (Cu), and combinations thereof. The conductive pattern 150 may prevent the electric charges generated by ESD or the like from accumulating on the surface (e.g., the first surface 110*a*) of the first substrate 110, thereby effectively preventing an ESD bruise defect.

The low refractive index pattern 160 may include a low refractive index material having a refractive index lower than silicon (Si). For example, the low refractive index pattern 160 may include, but is not limited to, at least one compound selected from silicon oxide, aluminum oxide, tantalum oxide, and a combination thereof. The low refractive index pattern 160 may increase the light collection efficiency by refracting or reflecting obliquely incident light, thereby increasing the quality of the image sensor.

A first protective film 165 may be formed on the surface insulating film 140 and the grid patterns. For example, the first protective film 165 may extend conformally along the profiles of the upper surface of the surface insulating film 140, and the side surfaces and the upper surface of the grid patterns, such as the conductive pattern 150 and the low refractive index pattern 160.

The first protective film 165 may include, but is not limited to, for example, aluminum oxide. The first protective film 165 may prevent damage to the surface insulating film 140 and the grid patterns, such as the conductive pattern 150 and the low refractive index pattern.

The microlens 180 may be disposed on (e.g., directly thereon) the color filter 170. In an embodiment, the microlens 180 may be arranged to correspond to unit pixels UP1 to UP4. For example, a plurality of microlenses 180 may be arranged two-dimensionally (e.g., in the form of a matrix) in a plane including the first direction DR1 and the second direction DR2 and each of the plurality of microlenses 180 may correspond to one unit pixel of the unit pixels, such as the first to fourth unit pixels UP1 to UP4.

As shown in the embodiment of FIG. 4, the microlens 180 has a convex shape, and may have a predetermined radius of curvature. The microlens 180 may concentrate light that is incident on the first photoelectric conversion unit PD1 and the second photoelectric conversion unit PD2 accordingly. In an embodiment, the microlens 180 may include a light-transmitting resin. However, embodiments of the present inventive concepts are not limited thereto.

A second protective film 185 may be formed on the microlens 180 (e.g., directly thereon). The second protective film 185 may extend along the surface of the microlens 180. The second protective film 185 may include, for example, an inorganic oxide film. For example, in an embodiment, the second protective film 185 may include at least one compound selected from silicon oxide, titanium oxide, zirconium oxide, hafnium oxide, and a combination thereof. However, embodiments of the present inventive concepts are not limited thereto. As an example, the second protective film 185 may include a low temperature oxide (LTO).

The second protective film 185 may protect the microlens 180 from the outside. For example, the second protective film 185 may protect the microlens 180 that includes an organic material, by including an inorganic oxide film. Further, the second protective film 185 may increase the quality of the image sensor by increasing the light collection efficiency of the microlens 180. For example, the second protective film 185 may reduce reflection, refraction, scattering or the like of the incident light that reaches the space between the microlenses 180, by filling the space between the microlenses 180.

Referring to FIGS. 3 and 5, in some image sensors according to embodiments of the present inventive concepts, the width of the pixel separation pattern 120 and the width of the region separation pattern 120_I may decrease from the second surface 110b of the first substrate 110 toward the first surface 110a of the first substrate 110.

This may be due to the characteristics of the etching process for forming the pixel separation pattern 120 and the region separation pattern 120_I. For example, in an embodiment, the process of etching the first substrate 110 to form the pixel separation pattern 120 and the region separation pattern 120_I may be performed on the second surface 110b of the first substrate 110.

In the image sensor according to some embodiments, the pixel separation pattern 120 and the region separation pattern 120_I may each include a filling film 120a and a spacer film 120b.

For example, a trench may be formed inside the first substrate 110. The spacer film 120b may extend along the side wall of the trench. The filling film 120a is formed on the spacer film 120b and may fill the remaining region of the trench. For example, the spacer film 120b may extend along the side walls of the filling film 120a, and may separate the first substrate 110 from the filling film 120a.

In an embodiment, the filling film 120a may include, for example, a conductive material. For example, the filling film 120a may include polysilicon (poly Si). However, embodiments of the present inventive concepts are not limited thereto. In some embodiments, a ground voltage or a negative voltage may be applied to the filling film 120a including the conductive material. In this embodiment, an ESD (electrostatic discharge) bruise defect of the image sensor may be effectively prevented. Here, the ESD bruise defect means a phenomenon in which the electric charges generated by ESD or the like are accumulated on the surface (e.g., the first substrate 110) of the substrate to cause a stain such as a bruise on the generated image.

In an embodiment, the spacer film 120b may include an oxide having a lower refractive index than the first substrate 110. For example, the spacer film 120b may include at least one compound selected from silicon oxide, aluminum oxide, tantalum oxide, and combinations thereof. However, embodiments of the present inventive concepts are not limited thereto. The spacer film 120b, which has a lower refractive index than the first substrate 110, may refract or reflect light obliquely incident on the first and second photoelectric conversion units PD_1 and PD_2. Further, the spacer film 120b may prevent the light charges generated in a specific unit pixel by the incident light from moving to the adjacent unit pixel by a random drift. For example, the spacer film 120b may increase the light-receiving rate of the first and second photoelectric conversion units PD_1 and PD_2 to increase the quality of the image sensor according to some embodiments.

Referring to FIGS. 3 and 6, in the image sensor according to some embodiments, the width of the pixel separation pattern 120 and the width of the region separation pattern 120_I may increase from the second surface 110b of the first substrate 110 toward the first surface 110a of the first substrate 110.

This may be due to the characteristics of the etching process for forming the pixel separation pattern 120 and the region separation pattern 120_I. For example, in an embodiment, the process of etching the first substrate 110 to form the pixel separation pattern 120 and the region separation pattern 120_I may be performed on the first surface 110a of the first substrate 110.

As shown in the embodiment of FIG. 6, the pixel separation pattern 120 may not completely penetrate the first substrate 110. For example, the pixel separation pattern 120 and the region separation pattern 120_I extend from the first surface 110a of the first substrate 110, but may not extend to the second surface 110b of the first substrate 110. For example, the bottom surface 120_bs of the pixel separation pattern 120 and the bottom surface 120_I_bs of the region separation pattern 120_I may be spaced apart from the second surface 110b of the first substrate 110 (e.g., in the vertical direction). For example, the first region 121 and the second region 122 may not be completely separated. Further, unlike the embodiment shown in FIG. 6 in which the bottom surface 120_I_bs of the region separation pattern 120_I and the bottom surface 120_bs of the pixel separation pattern 120 are positioned on the same plane (e.g., in the vertical direction), the bottom surface 120_I_bs of the region separation pattern 120_I and the bottom surface 120_bs of the pixel separation pattern 120 may be positioned on different planes (e.g., in the vertical direction).

Figure 7:
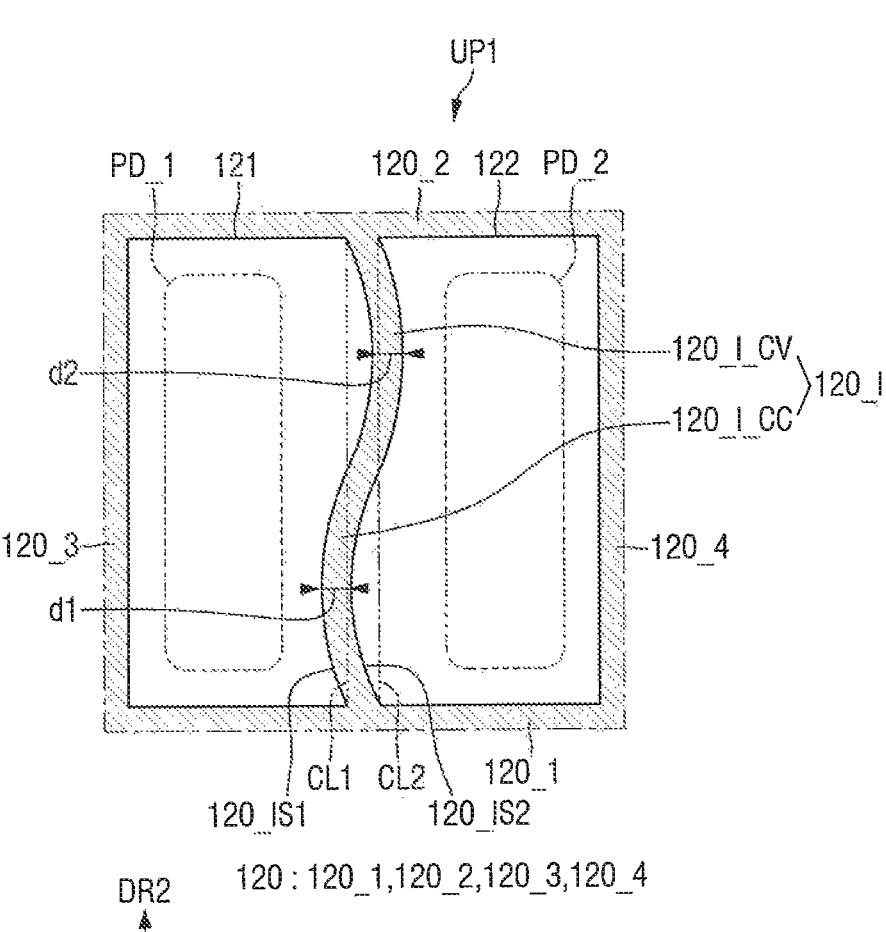
FIG. 7 is a layout diagram of the unit pixel of the image sensor according to an embodiment of the present inventive concepts.

FIG. 7 is a layout diagram for explaining the unit pixel of the image sensor according to some embodiments. For convenience of explanation, repeated parts of contents explained above using FIGS. 1 to 6 will be briefly explained or omitted.

Referring to FIG. 7, in the image sensor according to some embodiments, the region separation pattern 120_I may have a wavy shape in a plan view. For example, the side walls 120_IS1 and 120_IS2 of the region separation pattern 120_I may have a shape that includes at least one convex curve in first direction DR1 and at least one concave curve in the first direction DR1 in the plan view, For example, the region separation pattern 120_I may include a convex portion 120_I_CV in the first direction DR1 and a concave portion 120_I_CC in the first direction DR1. In an embodiment, a first maximum distance d1 (e.g., length in the first direction DR1) from the first center line CL1 to the first side wall 120_IS1 may differ from a second maximum distance d2 (e.g., length in the first direction DR1) from the second center line CL2 to the second side wall 120_IS2. Here, the first center line CL1 may be a virtual line that connects a joining point between the first side wall 120_IS1 and an inner side wall of the first pixel separation pattern 120_1 with a joining point between the first side wall 120_IS1 and an inner side wall of the second pixel separation pattern 120_2. The second center line CL2 may be a virtual line which connects a joining point between the second side wall 120_IS2 and an inner side wall of the first pixel separation pattern 120_1 with a joining point between the second side wall 120_IS2 and an inner side wall of the second pixel separation pattern 120_2. The first center line CL1 and the second center line CL2 may extend parallel to the second direction DR2.

For example, the first maximum distance d1 from the first center line CL1 to the first side wall 120_IS1, and the second maximum distance d2 from the second center line CL2 to the second side wall 120_IS2 may differ from each other. However, embodiments of the present inventive concepts are not limited thereto. For example, in an embodiment, the first maximum distance d1 from the first center line CL1 to the first side wall 120_IS1 may be the same as the second maximum distance d2 from the second center line CL2 to the second side wall 120_IS2.

Figure 8:
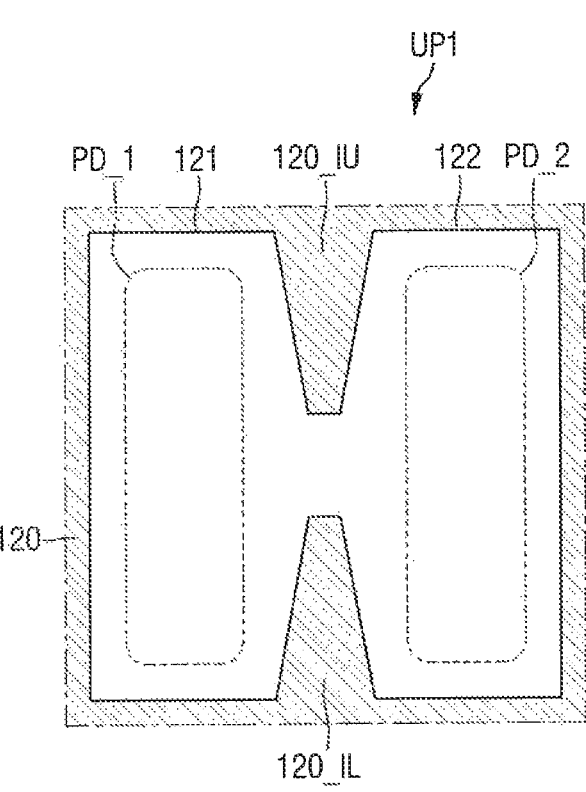
FIG. 8 is a layout diagram of the unit pixel of the image sensor according to an embodiment of the present inventive concepts.
Figure 8:

FIG. 8 is a layout diagram for explaining the unit pixels of the image sensor according to some embodiments. For convenience of explanation, repeated parts of contents explained above using FIGS. 1 to 7 will be briefly explained or omitted.

Referring to FIG. 8, in the image sensor according to some embodiments, the region separation pattern 120_I may include an upper portion 120_IU and a lower portion 120_IL that are separated from each other in the second direction DR2. The first region 121 and the second region 122 may be connected to each other accordingly.

For example, in an embodiment, the upper portion 120_IU and the lower portion 120_IL may have a trapezoidal shape in a plan view. A width of the upper portion 120_IU in the first direction DR1 and a width of the lower portion 120_IL in the first direction DR1 may decrease, as it goes away from the pixel separation pattern 120, such as the first and second pixel separation patterns 120_1, 120_2. Further, an inclined angle of the side wall of the upper portion 120_IU based on the second direction DR2, and an inclined angle of the side wall of the lower portion 120_IL based on the second direction DR2 may be the same as or different from each other. For example, in an embodiment, the inclined angle of the side wall of the upper portion 120 LU based on the second direction DR2 and/or the inclined angle of the side wall of the lower portion 120_IL based on the second direction DR2 may be in a range of about 22 degrees or more.

Figure 9:
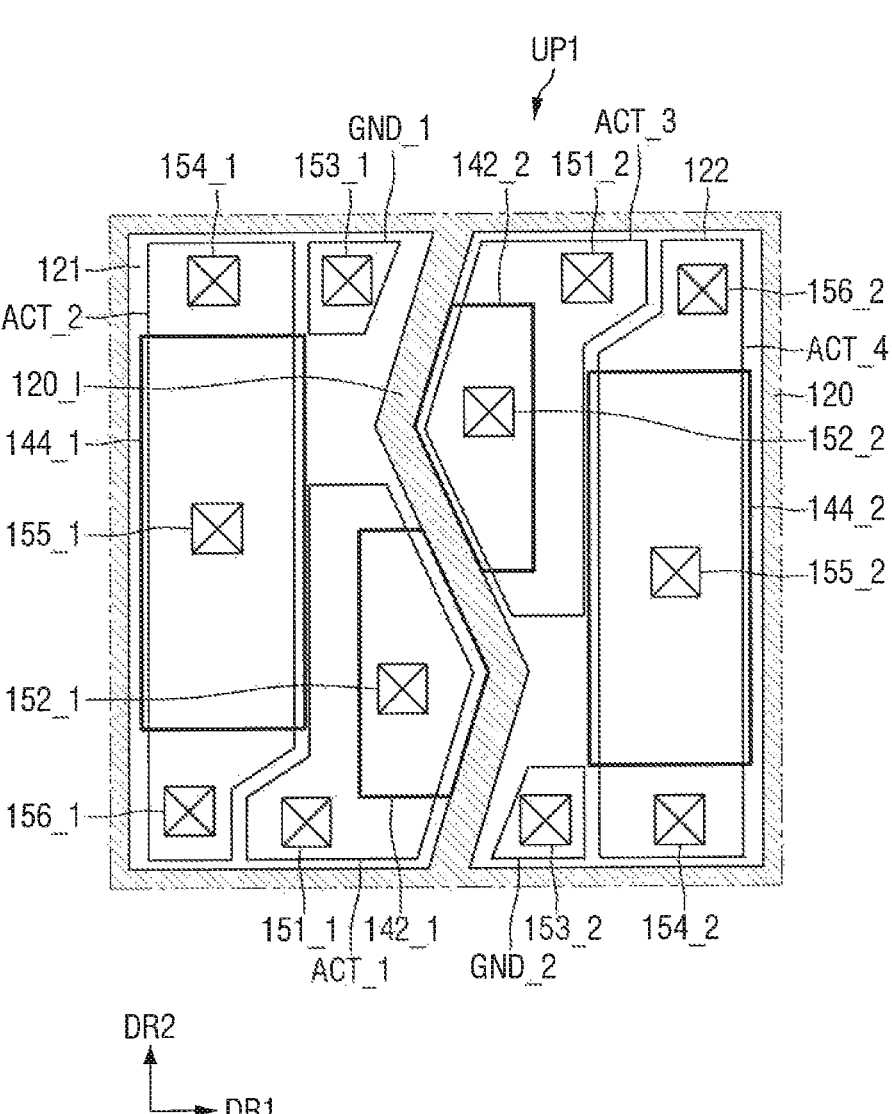
FIG. 9 is a layout diagram of the unit pixel of the image sensor according to an embodiment of the present inventive concepts.

FIG. 9 is a layout diagram for explaining the unit pixels of the image sensor according to some embodiments. For reference, FIG. 9 is a specific layout diagram of the image sensor shown in FIGS. 1 to 8.

Referring to the embodiment of FIG. 9, the first region 121 of the first unit pixel UP1 may include a first ground region GND_1, a first active region ACT_1, and a second active region ACT_2 that are spaced apart from each other. The second region 122 of the first unit pixel UP1 may include a second ground region GND_2, a third active region ACT_3, and a fourth active region ACT_4 that are spaced apart from each other. In an embodiment, the first and second ground regions GND_1 and GND_2 and the first to fourth active regions ACT_1, ACT_2, ACT_3, and ACT_4 may be separated by an element separation film.

In an embodiment, a first ground contact 153_1 connected to the first ground region GND_1 may be formed, and a second ground contact 153_2 connected to the second ground region GND_2 may be formed. The first ground contact 153_1 may provide a ground voltage to the first ground region GND_1, and the second ground contact 153_2 may provide a ground voltage to the second ground region GND_2.

A first transfer gate electrode 142_1 may be formed on the first active region ACT_1, and a second transfer gate electrode 142_2 may be formed on the third active region ACT_3. In an embodiment, the first transfer gate electrode 142_1 may correspond to the gate electrode of the first transfer transistor TG1 of FIG. 2, and the second transfer gate electrode 142_2 may correspond to the gate electrode of the second transfer transistor TG2 of FIG. 2. Bias may be applied to the first transfer gate electrode 142_1 through the first contact 152_1, and bias may be applied to the second transfer gate electrode 142_2 through the second contact 152_2.

As shown in the embodiment of FIG. 9, a first floating diffusion contact 151_1 may be connected to the floating diffusion region (FD of FIG. 2) inside the first active region ACT_1, and a second floating diffusion contact 151_2 may be connected to the floating diffusion region (FD of FIG. 2) inside the third active region ACT_3.

A gate electrode 144_1 of the first transistor may be formed on the second active region ACT_2, and a gate electrode 144_2 of the second transistor may be formed on the fourth active region ACT_4. A third contact 155_1 may provide bias to the gate electrode 144_1 of the first transistor, and a fourth contact 155_2 may provide bias to the gate electrode 144_2 of the second transistor. A source region of the first transistor may be connected to a fifth contact 154_1, and a source region of the second transistor may be connected to a sixth contact 154_2. A drain region of the first transistor may be connected to a seventh contact 156_1, and a drain region of the second transistor may be connected to an eighth contact 156_2.

The first transistor and the second transistor may each correspond to one of the source follower transistor SF, the selection transistor SEL, and the reset transistor RG of FIG. 2. However, embodiments of the present inventive concepts are not limited to the arrangement shown in FIG. 9. For example, the number of first transistors included in the first region 121, and the number of second transistors included in the second region 122 may vary and may differ from each other in some embodiments.

FIGS. 10 to 14 are layout diagrams for explaining the unit pixels of the image sensor according to some embodiments. For convenience of explanation, repeated parts of contents explained above using FIGS. 1 to 9 will be briefly explained or omitted.

Figure 10:
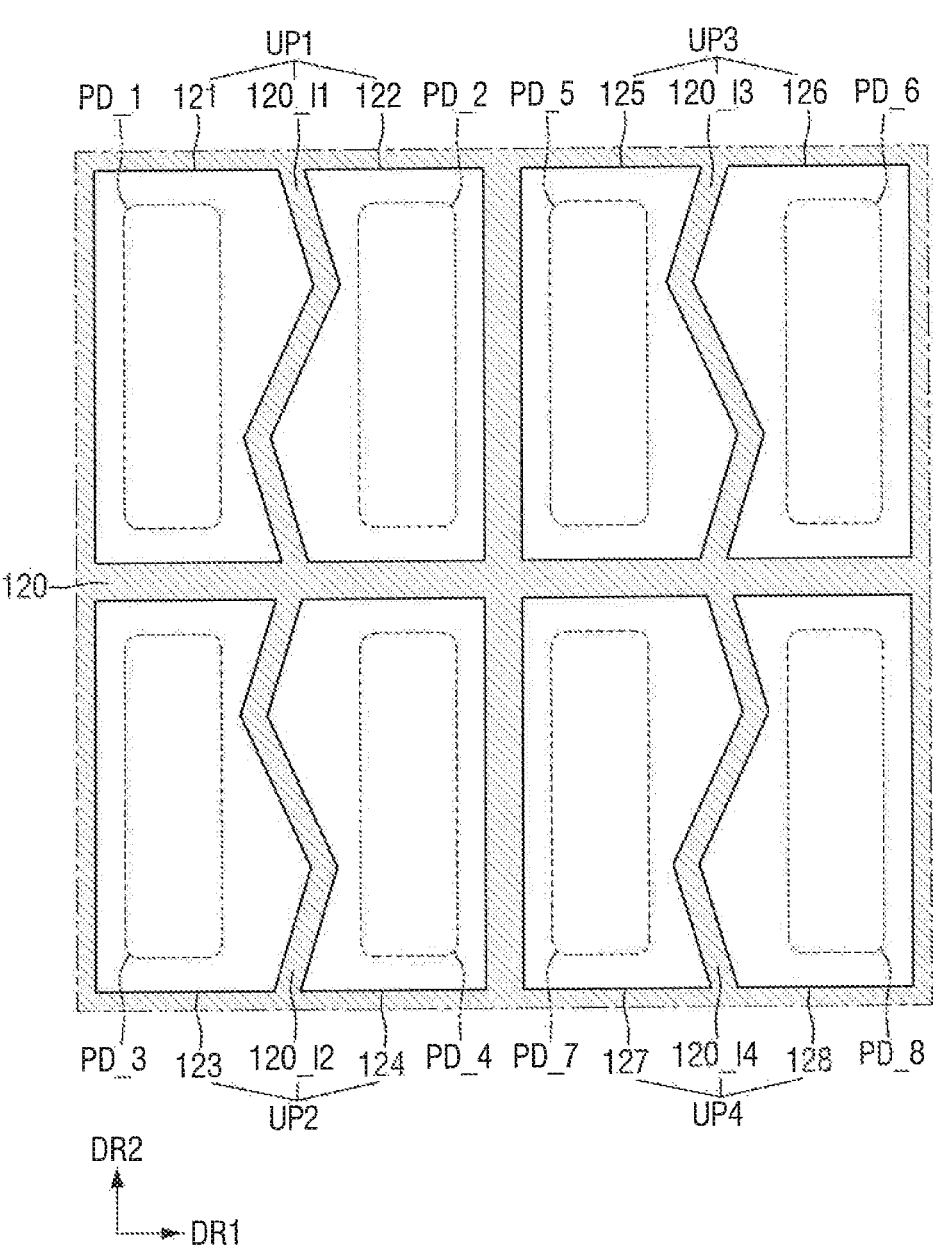
FIGS. 10 to 14 are layout diagrams of the unit pixel of the image sensor according to embodiments of the present inventive concepts.

Referring to FIG. 10, in the image sensor according to some embodiments, a plurality of unit pixels, such as first to fourth unit pixels UP1 to UP4, may be formed on the first substrate 110. For example, the second unit pixel UP2 may be positioned adjacent to the first unit pixel UP1 in the second direction DR2, the third unit pixel UP3 may be positioned adjacent to the first unit pixel UP1 in the first direction DR1, and the fourth unit pixel UP4 may be positioned adjacent to the third unit pixel UP3 in the second direction DR2 and adjacent to the second unit pixel UP2 in the first direction DR1. For example, the fourth unit pixel UP4 may be arranged diagonally with the first unit pixel UP1 and the third unit pixel UP3 may be arranged diagonally with the second unit pixel UP2.

Each of the first to fourth unit pixels UP1 to UP4 may include first photoelectric conversion units PD_1, PD_3, PD_5, and PD_7, respectively, second photoelectric conversion units PD_2, PD_4, PD_6, and PD_8, respectively, and region separation patterns 120_I1 to 120_I4, respectively, which are disposed between the first photoelectric conversion units PD_1, PD_3, PD_5, and PD_7 and the second photoelectric conversion units PD_2, PD_4, PD_6, and PD_8, respectively.

In an embodiment, the first region separation pattern 120_I1 may have the same shape as at least one of the second to fourth region separation patterns 120_I2 to 120_I4. For example, the first region separation pattern 120_I1 may have a shape that is symmetrical with at least one of the second to fourth region separation patterns 120_I2 to 120_I4 on the basis of the first direction DR1. The first region separation pattern 120_I1 may have a shape that is symmetrical with at least one of the second to fourth region separation patterns 120_I2 to 120_I4 on the basis of the second direction DR2.

For example, as shown in the embodiment of FIG. 10, the first region separation pattern 120_I1 and the third region separation pattern 120_I3 may have a shape that is symmetrical with the second region separation pattern 120_I2 and the fourth region separation pattern 120_I4, respectively, on the basis of the first direction DR1. The first region separation pattern 120_I1 and the second region separation pattern 120_I2 may have a shape that is symmetrical with the third region separation pattern 120_I3 and the fourth region separation pattern 120_I4, respectively, on the basis of the second direction DR2. However, embodiments of the present inventive concepts are not limited thereto.

Figure 11:
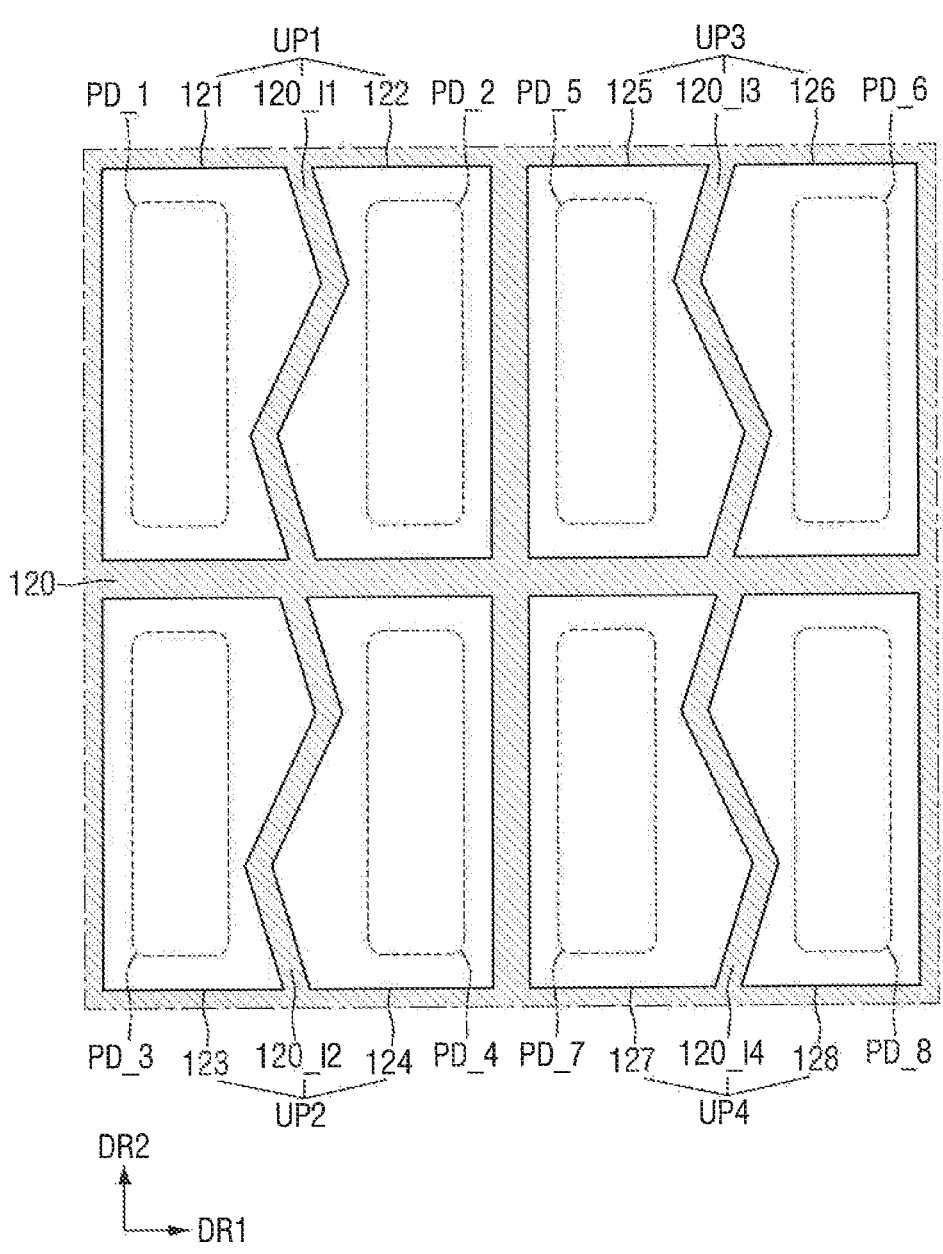

Referring to the embodiment of FIG. 11, the first region separation pattern 120_I1 and the second region separation pattern 120_I2 may have a shape that is symmetrical with the third region separation pattern 120_I3 and the fourth region separation pattern 120_I4 on the basis of the second direction DR2.

Figure 12:
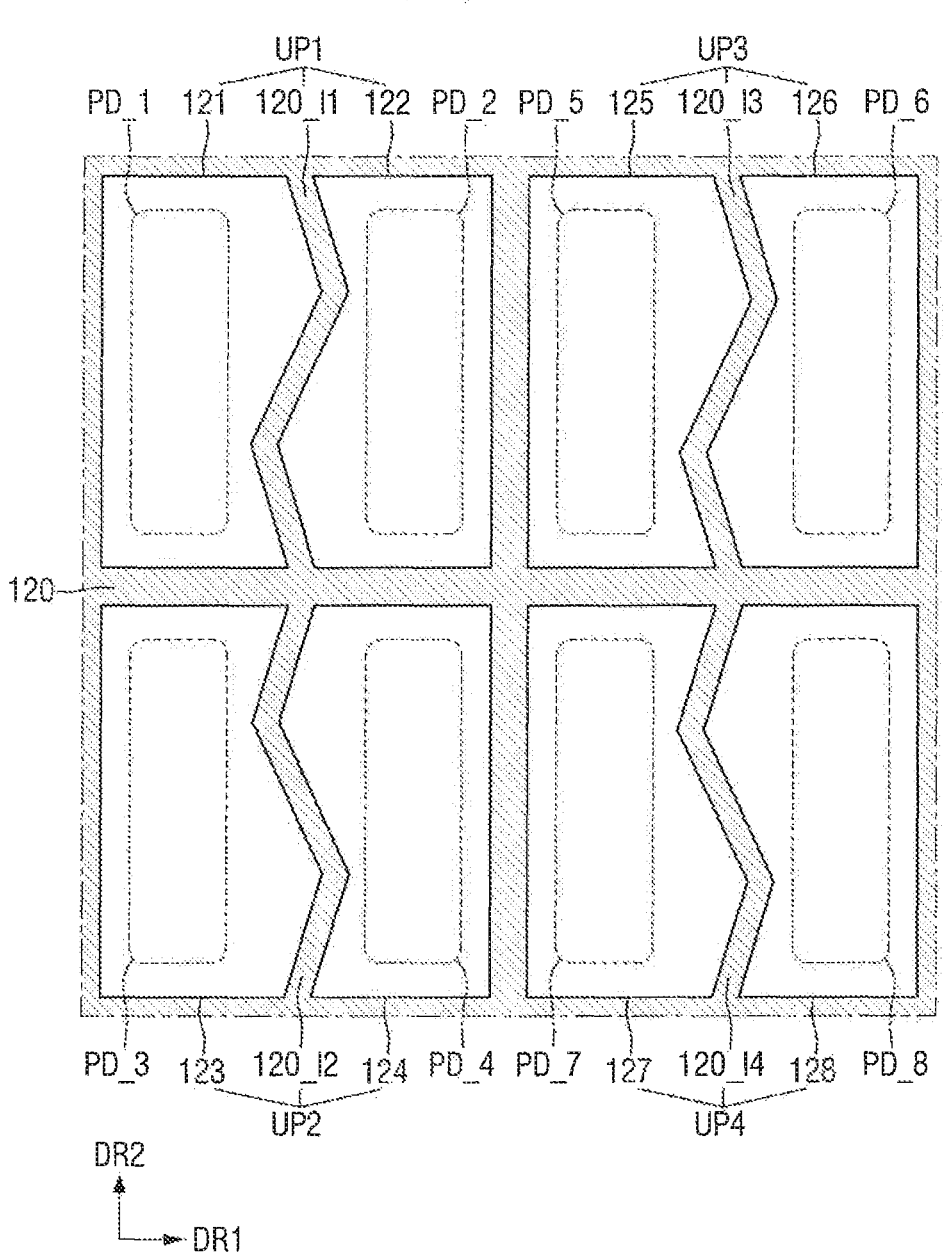

Referring to FIG. 12, the first region separation pattern 120_I1 and the third region separation pattern 120_I3 may have a shape that is symmetrical with the second region separation pattern 120_I2 and the fourth region separation pattern 120_I4 on the basis of the first direction. DR1.

Figure 13:
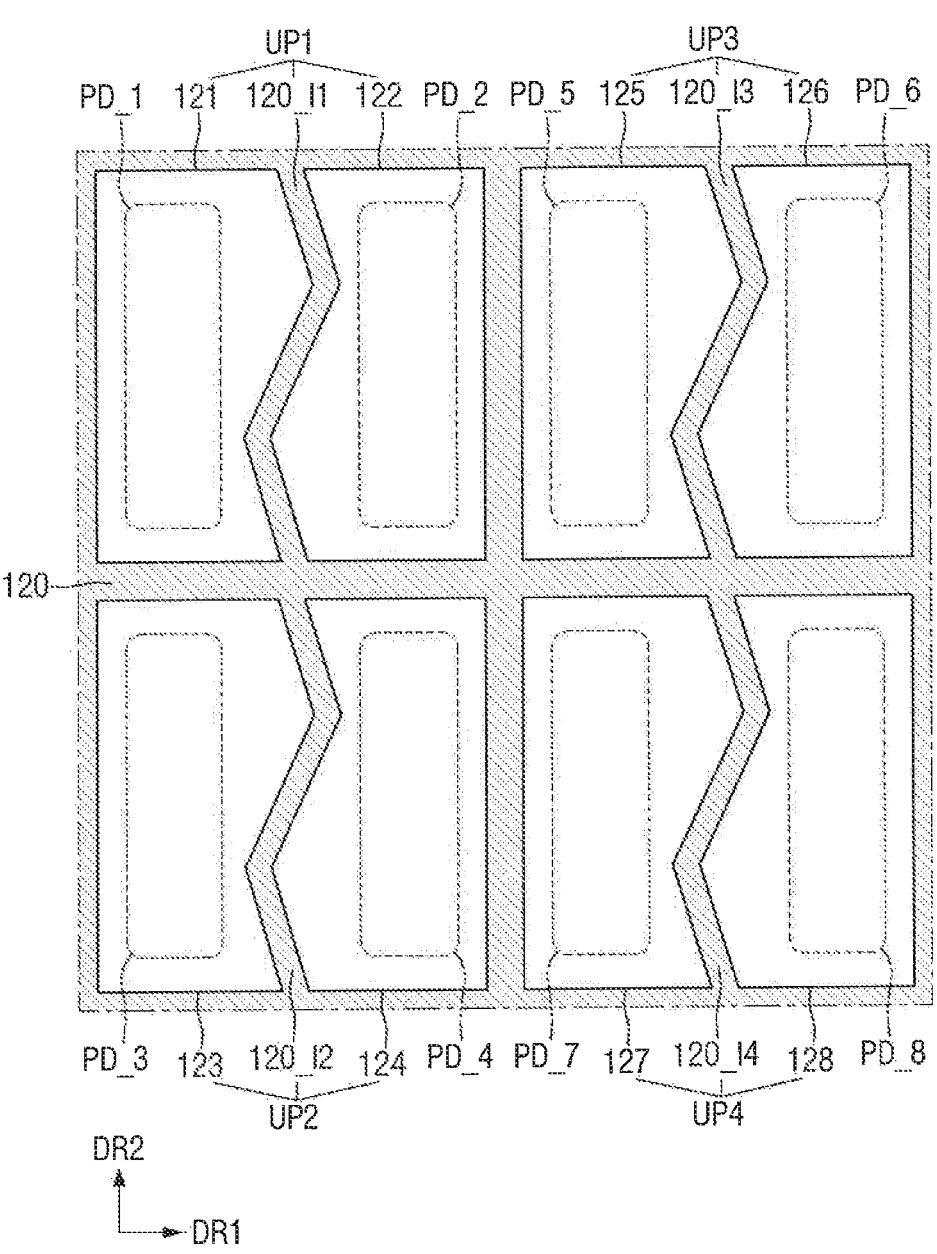

Referring to FIG. 13, the first to fourth region separation patterns 120_I1 to 120_I4 may have the same shape as each other.

However, embodiments of the present inventive concepts are not limited to the arrangements shown in FIGS. 10 to 13, and the shapes of the first to fourth region separation patterns 120_I1 to 120_I4 may vary.

Figure 14:
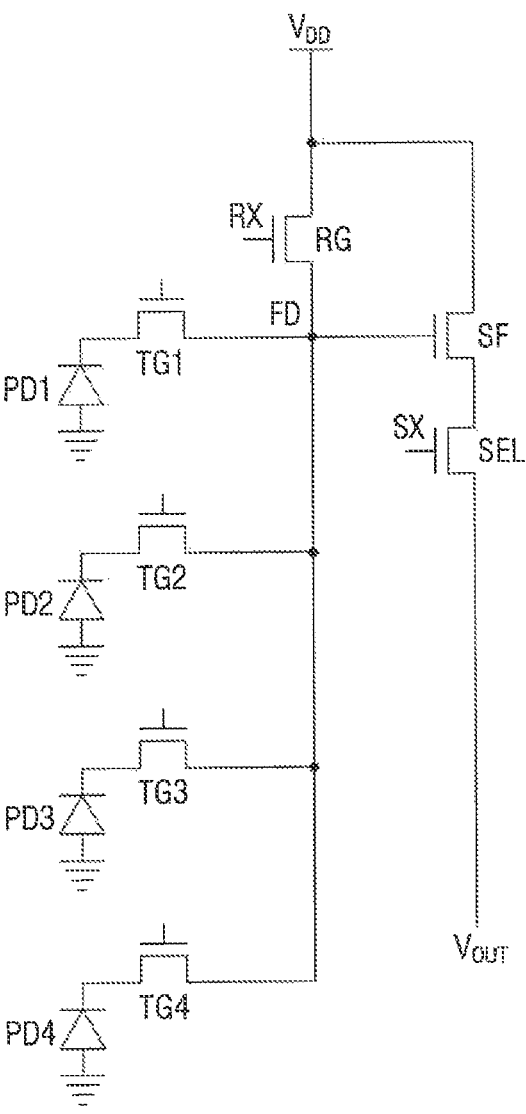

FIG. 14 is an exemplary circuit diagram for explaining a unit pixel of an image sensor according to some embodiments. For convenience of explanation, repeated parts of contents explained above using FIGS. 1 to 13 will be briefly explained or omitted.

Referring to FIG. 14, the unit pixel of the image sensor according to some embodiments may include first to fourth photoelectric conversion units PD1 to PD4. Each of the first to fourth transfer transistors TG_1 to TG_4 may be coupled to each of the first to fourth photoelectric conversion units PD1 to PD4, respectively. In an embodiment, the first to fourth transfer transistors TG_1 to TG_4 may share the floating diffusion region FD. However, embodiments of the present inventive concepts are not limited thereto.

Figure 15:
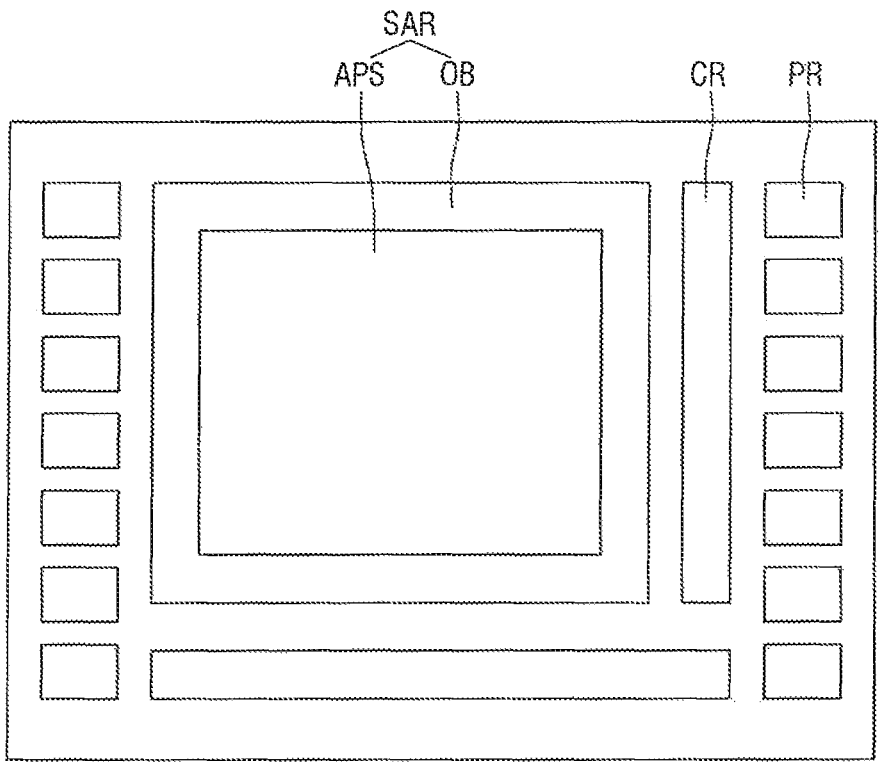
FIG. 15 is a schematic layout diagram of the image sensor according to an embodiment of the present inventive concepts.
Figure 16:
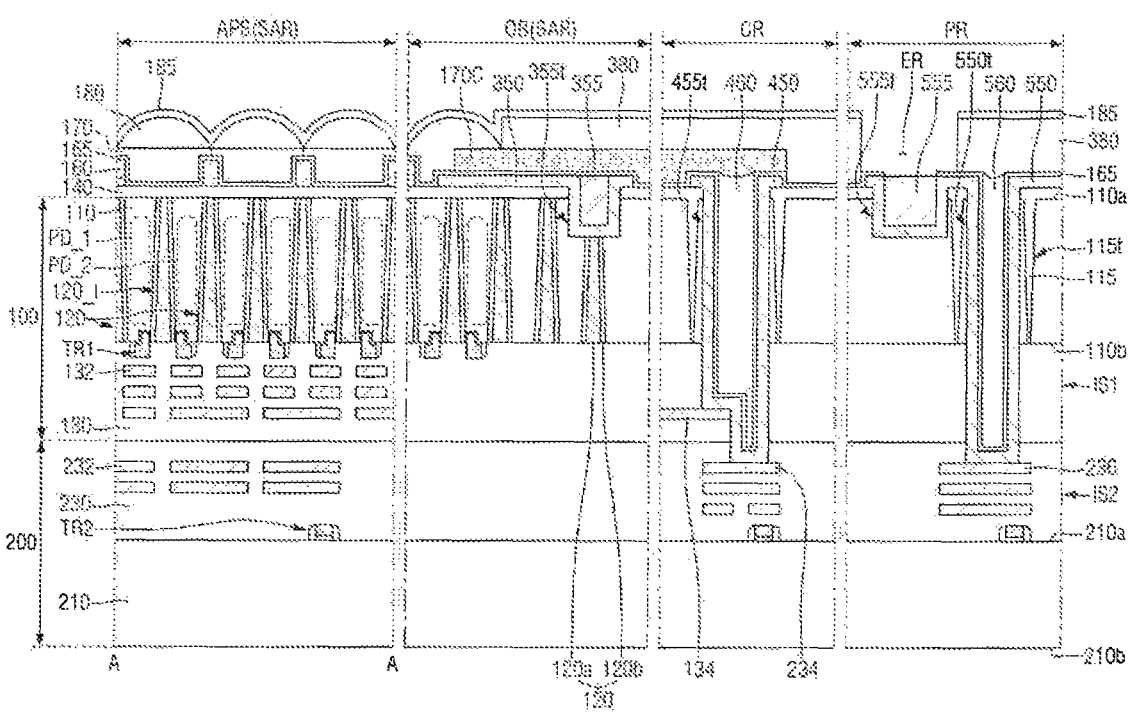
FIGS. 16 and 17 are schematic cross-sectional views of the image sensor according to embodiments of the present inventive concepts.
Figure 17:
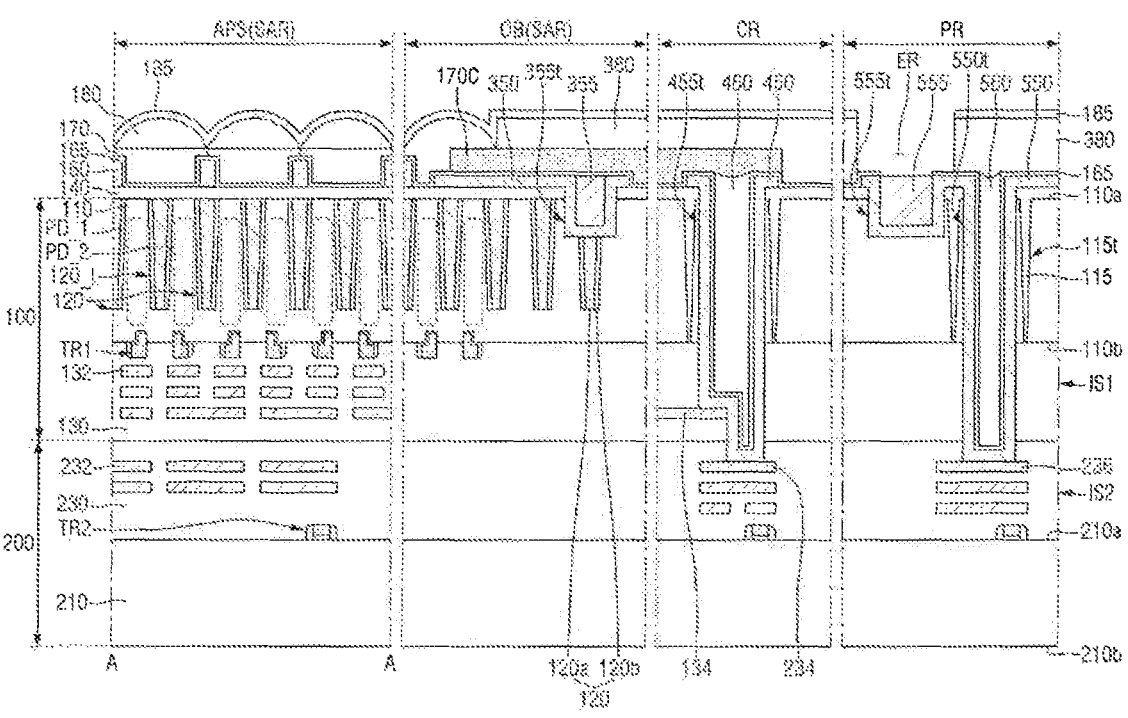

FIG. 15 is a schematic layout diagram for explaining an image sensor according to some embodiments. FIGS. 16 and 17 are schematic cross-sectional views for explaining an image sensor according to some embodiments. For convenience of explanation, repeated parts of contents explained above using FIGS. 1 to 14 will be briefly explained or omitted.

Referring to FIGS. 15 and 16, the image sensor according to some embodiments may include a sensor array region SAR, a connection region CR, and a pad region PR.

The sensor array region SAR may include a region corresponding to the active pixel sensor array 10 of FIG. 1. For example, a plurality of unit pixels (e.g., the first unit pixel UP1 of FIG. 3) arranged two-dimensionally (e.g., in the form of a matrix) may be formed inside the sensor array region SAR.

The sensor array region SAR may include a light-receiving region APS and a light-shielding region OB. The active pixels that receive light and generate an active signal may be arranged inside the light-receiving region APS. Optical black pixels that shield light to generate an optical black signal may be arranged in the light-shielding region OB. Although the light-shielding region OB may be formed, for example, along the periphery of the light-receiving region APS, this is merely an example and the arrangement of the light-shielding region OB may vary.

In some embodiments, the first and second photoelectric conversion units and PD_2 may not be formed in a portion of the light-shielding region OB. For example, the first and second photoelectric conversion units PD_1 and PD_2 may be formed inside the first substrate 110 of the light-shielding region OB adjacent to the light-receiving region APS, but may not be formed inside the first substrate 110 of the light-shielding region OB spaced apart from the light-receiving region APS.

In some embodiments, dummy pixels may be formed in the light-receiving region APS adjacent to the light-shielding region OB. However, embodiments of the present inventive concepts are not limited thereto.

The connection region CR may be formed around the sensor array region SAR. Although in FIG. 15, the connection region CR is illustrated as being formed on one side of the sensor array region SAR, exemplary embodiments of the present inventive concepts are not limited thereto and the arrangement of the connection region CR may vary. Wirings are formed in the connection region CR, and may be configured to transmit and receive electrical signals of the sensor array region SAR.

A pad region PR may be formed around the sensor array region SAR. Although the pad region PR is illustrated in FIG. 15 to be disposed adjacent to the edge of the image sensor, embodiments of the present inventive concepts are not limited thereto and the arrangement of the pad region PR may vary. In an embodiment, the pad region PR is connected to an external device or the like, and may be configured to transmit and receive electrical signals between the image sensor and the external device.

Although the connection region CR is illustrated in FIG. 15 as being interposed between the sensor array region SAR and the pad region PR, embodiments of the present inventive concepts are not limited thereto. The placement of the sensor array region SAR, the connection region CR and the pad region PR may vary.

As shown in the embodiment of FIG. 16, the first substrate 110 and the first wiring structure IS1 may form the first substrate structure 100 of the image sensor.

In some embodiments, the first wiring structure IS1 may include a first wiring 132 in the sensor array region SAR, and a second wiring 134 in the connection region CR. The first wiring 132 may be electrically connected to unit pixels (e.g., the first to fourth unit pixels UP1 to UP4 of FIG. 3) of the sensor array region SAR. For example, the first wiring 132 may be connected to the first electronic element TR1. At least a portion of the second wiring 134 may extend from the sensor array region SAR. For example, at least a portion of the second wiring 134 may be electrically connected to at least a portion of the first wiring 132. Accordingly, the second wiring 134 may be electrically connected to the unit pixels (e.g., the first to fourth unit pixels UP1 to UP4 of FIG. 3) of the sensor array region SAR.

As shown in the embodiment of FIG. 16, the image sensor may include a second substrate 210 and a second wiring structure IS2.

In an embodiment, the second substrate 210 may be bulk silicon or SOI (silicon-on-insulator). The second substrate 210 may be a silicon substrate or may include other materials, for example, at least one compound selected from silicon germanium, indium antimonide, lead tellurium compounds, indium arsenic, indium phosphide, gallium arsenide or gallium antimonide. However, embodiments of the present inventive concepts are not limited thereto. Alternatively, the second substrate 210 may have an epitaxial layer formed on the base substrate.

The second substrate 210 may include a third surface 210*a* and a fourth surface 210*b* that are opposite to each other (e.g., in a vertical direction). The third surface 210*a* of the second substrate 210 may be a surface that faces the second surface 110*b* of the first substrate 110.

A plurality of electronic elements may be disposed on the second substrate 210. For example, a second electronic element TR2 may be disposed on the third surface 210*a* of the second substrate 210. In an embodiment, the second electronic element TR2 is electrically connected to the sensor array region SAR and may transmit and receive electrical signals to and from each unit pixel of the sensor array region SAR. For example, the second electronic element TR2 may include the electronic elements that constitute the row decoder 20, the row driver 30, the column decoder 40, the timing generator 50, the correlated double sampler 60, the analog-to-digital converter 70 or the I/O buffer 80 of FIG. 1.

The second wiring structure IS2 may be disposed on the second substrate 210. In some embodiments, the second wiring structure IS2 may be disposed on the third surface 210*a* of the second substrate 210. The second substrate 210 and the second wiring structure IS2 may form the second substrate structure 200.

The second wiring structure IS2 may be attached to the first wiring structure IS1. For example, as shown in FIG. 16, the upper surface of the second wiring structure IS2 may be attached to the lower surface of the first wiring structure IS1.

The second wiring structure IS2 may be made up of one or more wirings. For example, in an embodiment, the second wiring structure IS2 may include a second wiring insulating film 230, and a plurality of wirings, such as third to fifth wirings 232, 234, and 236, inside the second wiring insulating film 230. The number of layers of wirings that constitute the second wiring structure IS2, the arrangement thereof and the like shown in the embodiment of FIG. 16 are merely examples, and embodiments of the present inventive concepts are not limited thereto.

At least a portion of the wirings, such as the third to fifth wirings 232, 234, and 236, of the second wiring structure IS2 may be connected to the second electronic element TR2. In some embodiments, the second wiring structure IS2 may include a third wiring 232 in the sensor array region SAR, a fourth wiring 234 in the connection region CR, and a fifth wiring 236 in the pad region PR. In some embodiments, the fourth wiring 234 may be an uppermost wiring of the plurality of wiring in the connection region CR, and the fifth wiring 236 may be an uppermost wiring of the plurality of wirings in the pad region PR. However, embodiments of the present inventive concepts are not limited thereto.

The image sensor according to some embodiments may include a first connection structure 350, a second connection structure 450, and a third connection structure 550.

The first connection structure 350 may be disposed inside the light-shielding region OB. The first connection structure 350 may be disposed on the surface insulating film 140 of the light-shielding region OB. In some embodiments, the first connection structure 350 may be in direct contact with the pixel separation pattern 120. For example, a first trench 355*t* that exposes the pixel separation pattern 120 may be formed inside the first substrate 110 and the surface insulating film 140 of the light-shielding region OB. The first connection structure 350 is formed in the first trench 355*t* and may be in direct contact with the pixel separation pattern 120 in the light-shielding region OB. In some embodiments, the first connection structure 350 may extend along the profiles of the side surfaces and the lower surface of the first trench 355*t*.

In an embodiment, the first connection structure 350 may include, for example, at least one compound selected from titanium (Ti), titanium nitride (TiN), tantalum (Ta), tantalum nitride (TaN), tungsten (W), aluminum (Al), copper (Cu) and combinations thereof. However, embodiments of the present inventive concepts are not limited thereto.

In some embodiments, the first connection structure 350 may be electrically connected to the pixel separation film 120 and apply a ground voltage or a negative voltage to the pixel separation film 120. Accordingly, the electric charges generated by ESD or the like may be discharged to the first connection structure 350 through the pixel separation pattern 120, and an ESD bruise defect may be effectively prevented.

In some embodiments, a first pad 355 that fills the first trench 355*t* may be formed on the first connection structure 350. In an embodiment, the first pad 355 may include at least one compound selected from tungsten (W), copper (Cu), aluminum (Al), gold (Au), silver (Ag), and alloys thereof. However, embodiments of the present inventive concepts are not limited thereto.

In some embodiments, the first protective film 165 may cover the first connection structure 350 and the first pad 355. For example, the first protective film 165 may extend along the profiles of the first connection structure 350 and an upper surface of the first pad 355.

As shown in the embodiment of FIG. 16, the second connection structure 450 may be disposed inside the connection region CR. The second connection structure 450 may be formed on the surface insulating film 140 of the connection region CR. The second connection structure 450 may electrically connect the first substrate structure 100 and the second substrate structure 200. For example, a second trench 455*t* that exposes the second wiring 134 and the fourth wiring 234 may be formed inside the first substrate structure 100 and the second substrate structure 200 of the connection region CR. The second connection structure 450 is formed inside the second trench 455t and may connect the second wiring 134 with the fourth wiring 234. In some embodiments, the second connection structure 450 may extend along the profiles of the side surfaces and the lower surface of the second trench 455t.

In an embodiment, the second connection structure 450 may include, for example, at least one compound selected from titanium (Ti), titanium nitride (TiN), tantalum (Ta), tantalum nitride (TaN), tungsten (W), aluminum (Al), copper (Cu), and combinations thereof. However, embodiments of the present inventive concepts are not limited thereto. In some embodiments, the second connection structure 450 may be formed at the same level as the first connection structure 350 (e.g., in the vertical direction).

In some embodiments, the first protective film 165 may cover the second connection structure 450. For example, the first protective film 165 may extend along the profile of the second connection structure 450.

In some embodiments, a first filling insulating film 460 that fills the second trench 455t may be disposed on the second connection structure 450. In an embodiment, the first filling insulating film 460 may include, for example, at least one compound selected from silicon oxide, aluminum oxide, tantalum oxide, and a combination thereof. However, embodiments of the present inventive concepts are not limited thereto.

A third connection structure 550 may be disposed inside the pad region PR. The third connection structure 550 may be disposed on the surface insulating film 140 of the pad region PR. The third connection structure 550 may electrically connect the second wiring structure IS2 to an external device or the like.

For example, a third trench 550t that exposes the fifth wiring 236 may be formed inside the first substrate structure 100 and the second substrate structure 200 of the pad region PR. The third connection structure 550 is disposed in the third trench 550t and may be in contact with the fifth wiring 236. Further, a fourth trench 555t may be formed inside the first substrate 110 of the pad region PR. The third connection structure 550 may be disposed inside the fourth trench 555t and exposed. In some embodiments, the third connection structure 550 may extend along the profiles of the side surfaces and the lower surfaces of the third trench 550t and the fourth trench 555t.

In an embodiment, the third connection structure 550 may include, for example, at least one compound selected from titanium (Ti), titanium nitride (TiN), tantalum (Ta), tantalum nitride (TaN), tungsten (W), aluminum (Al), copper (Cu), and combinations thereof. However, embodiments of the present inventive concepts are not limited thereto. In some embodiments, the third connection structure 550 may be formed at the same level as the first connection structure 350 and the second connection structure 450 (e.g., in the vertical direction).

In some embodiments, a second filling insulating film 560 that fills the third trench 550t may be disposed on the third connection structure 550. In an embodiment, the second filling insulating film 560 may include, for example, at least one compound selected from silicon oxide, aluminum oxide, tantalum oxide, and a combination thereof. However, embodiments of the present inventive concepts are not limited thereto. In some embodiments, the second filling insulating film 560 may be formed at the same level as the first filling insulating film 460 (e.g., in the vertical direction).

In some embodiments, a second pad 555 that fills the fourth trench 555t may be disposed on the third connection structure 550. In an embodiment, the second pad 555 may include, for example, at least one compound selected from tungsten (W), copper (Cu), aluminum (Al), gold (Au), silver (Ag), and alloys thereof. However, embodiments of the present inventive concepts are not limited thereto. In some embodiments, the second pad 555 may be formed at the same level as the first pad 355 (e.g., in the vertical direction).

In some embodiments, the first protective film 165 may cover the third connection structure 550. For example, the first protective film 165 may extend along the profile of the third connection structure 550. In some embodiments, the first protective film 165 may expose the second pad 555.

In some embodiments, the element separation pattern 115 may be formed inside the first substrate 110. For example, an element separation trench 115t may be disposed inside the first substrate 110. For example, the element separation pattern 115 may be disposed inside the element separation trench 115t.

Although in FIG. 16, the element separation pattern 115 is shown as being disposed only around the second connection structure 450 of the connection region CR and around the third connection structure 550 of the pad region PR, embodiments of the present inventive concepts are not limited thereto. For example, in some embodiments, the element separation pattern 115 may be disposed around the first connection structure 350 of the light-shielding region OB.

In an embodiment, the element separation pattern 115 may include, for example, at least one compound selected from silicon oxide, silicon nitride, silicon oxynitride, aluminum oxide, hafnium oxide, and combinations thereof. However, embodiments of the present inventive concepts are not limited thereto. In some embodiments, the element separation pattern 115 may be disposed at the same level as the surface insulating film 140 (e.g., in the vertical direction).

As shown in the embodiment of FIG. 16, a light-shielding color filter 170C may be disposed on the first connection structure 350 and the second connection structure 450. For example, the light-shielding color filter 170C may be formed to cover a portion of the first protective film 165 in the light-shielding region OB and the connection region CR. In an embodiment, the light-shielding color filter 170C may include, for example, a blue color filter. However, embodiments of the present inventive concepts are not limited thereto.

In some embodiments, a third protective film 380 may be disposed on the light-shielding color filter 170C. For example, the third protective film 380 may be formed to cover a portion of the first protective film 165 in the light-shielding region OB, the connection region CR and the pad region PR. In some embodiments, the second protective film 185 may extend along the surface of the third protective film 380. In an embodiment, the third protective film 380 may include, for example, a light-transmitting resin. However, embodiments of the present inventive concepts are not limited thereto. In some embodiments, the third protective film 380 may include the same material as the microlens 180.

In some embodiments, the second protective film 185 and the third protective film 380 may expose the second pad 555. For example, an exposure opening ER that exposes the second pad 555 may be formed inside the second protective film 185 and the third protective film 380. Accordingly, the second pad 555 may be connected to an external device or the like, and configured to transmit and receive electrical signals between the image sensor according to some embodiments and the external device. For example, the second pad 555 may be an I/O pad of the image sensor according to some embodiments.

Referring to FIG. 17, in the image sensor according to some embodiments, the width of the pixel separation pattern 120 and the width of the region separation pattern 120_I may increase from the second surface 110*b* of the first substrate 110 toward the first surface 110*a* of the first substrate 110.

In concluding the detailed description, those skilled in the art will appreciate that many variations and modifications may be made to the described embodiments without substantially departing from the principles of the present inventive concepts. Therefore, the disclosed embodiments of the present inventive concepts are used in a generic and descriptive sense only and not for purposes of limitation.

What is claimed is:

1. An image sensor comprising:
a substrate including a first surface and a second surface opposite to the first surface;
a first photoelectric conversion unit;
a second photoelectric conversion unit;
a third photoelectric conversion unit;
a fourth photoelectric conversion unit;
a first microlens on the first and second photoelectric conversion units;
a second microlens on the third and fourth photoelectric conversion units;
a pixel separation pattern surrounding the first and second photoelectric conversion units and being disposed between the second photoelectric conversion unit and the third photoelectric conversion unit, wherein the pixel separation pattern extending into the substrate; and
a region separation pattern extending into the substrate between the first photoelectric conversion unit and the second photoelectric conversion unit,
wherein the first to fourth photoelectric conversion units are sequentially arranged in a first direction in a plan view,
wherein the region separation pattern between the first photoelectric conversion unit and the second photoelectric conversion unit is not a straight line shape and includes two portions, and each of the two portions is not parallel to the first direction and a second direction perpendicular to the first direction in the plan view, wherein the two portions overlap each other in the second direction, and the region separation pattern does not include a line shape extending parallel to either of the first direction or the second direction,
wherein the pixel separation pattern includes four portions and two portions out of the four portions are parallel to the second direction in the plan view,
wherein the first photoelectric conversion unit has a top surface near the first surface of the substrate and a bottom surface near the second surface of the substrate,
wherein the region separation pattern has a bottom surface near the second surface of the substrate,
wherein a distance from the first surface of the substrate to the bottom surface of the region separation pattern is longer than a distance from the first surface of the substrate to the top surface of the first photoelectric conversion unit,
wherein one of the two portions of the region separation pattern extends from one side of a central portion of the first photoelectric conversion unit and the second photoelectric conversion unit to another side of the central portion of the first photoelectric conversion unit and the second photoelectric conversion unit in the plan view,
wherein the four portions include a first-first portion being parallel to the first direction and a second portion being parallel to the second direction, and
wherein the region separation pattern has a first part directly connected to the first-first portion in the plan view.

2. The image sensor of claim 1, wherein the distance from the first surface of the substrate to the bottom surface of the region separation pattern is longer than a distance from the first surface of the substrate to a center point between the top surface of the first photoelectric conversion unit and the bottom surface of the first photoelectric conversion unit.

3. The image sensor of claim 2, wherein the pixel separation pattern is connected to the first surface of the substrate and the second surface of the substrate.

4. The image sensor of claim 1, wherein the four portions include a second-first portion being parallel to the first direction, and
wherein the region separation pattern has a second part directly connected to the second-first portion in the plan view.

5. The image sensor of claim 4, wherein the region separation pattern has a zigzag shape.

6. The image sensor of claim 4, wherein the first part of the region separation pattern is not parallel to the second part of the region separation pattern.

7. The image sensor of claim 4, wherein the first part of the region separation pattern is parallel to the second part of the region separation pattern.

8. The image sensor of claim 5, wherein a length of the region separation pattern in a third direction from the first surface of the substrate to the second surface of the substrate is shorter than a length of the substrate from the first surface of the substrate to the second surface of the substrate.

9. The image sensor of claim 5, wherein the region separation pattern extends from the first surface of the substrate to the second surface of the substrate.

10. The image sensor of claim 8, wherein the region separation pattern is spaced apart from the second surface of the substrate.

11. The image sensor of claim 8, wherein a width of the region separation pattern on the first surface of the substrate in the first direction in the plan view is different from a width of the bottom surface of the region separation pattern in the first direction in the plan view.

12. An image sensor comprising:
a substrate including a first surface and a second surface opposite to the first surface;
a first unit pixel including a first photoelectric conversion unit and a second photoelectric conversion unit;
a second unit pixel including a third photoelectric conversion unit and a fourth photoelectric conversion unit;
a first microlens on the first and second photoelectric conversion units;
a second microlens on the third and fourth photoelectric conversion units;
a pixel separation pattern surrounding the first unit pixel, wherein the pixel separation pattern extending into the substrate;
a first region separation pattern extending into the substrate between the first photoelectric conversion unit and the second photoelectric conversion unit; and a second region separation pattern extending into the substrate between the third photoelectric conversion unit and the fourth photoelectric conversion unit, wherein the first to fourth photoelectric conversion units are sequentially arranged in a first direction in a plan view, wherein each of the first region separation pattern between the first photoelectric conversion unit and the second photoelectric conversion unit and the second region separation pattern between the third photoelectric conversion unit and the fourth photoelectric conversion unit, is not a straight line shape and includes two portions, each of the two portions of each of the first and second region separation patterns is not parallel to the first direction and a second direction perpendicular to the first direction in the plan view, wherein the two portions overlap each other in the second direction, and the first and second region separation patterns do not include a line shape extending parallel to either of the first direction or the second direction, wherein the pixel separation pattern includes four portions and two portions out of the four portions are parallel to the second direction in the plan view, wherein the first photoelectric conversion unit has a top surface near the first surface of the substrate and a bottom surface near the second surface of the substrate, wherein the first region separation pattern has a bottom surface near the second surface of the substrate, wherein a distance from the first surface of the substrate to the bottom surface of the first region separation pattern is longer than a distance from the first surface of the substrate to the top surface of the first photoelectric conversion unit, wherein one of the two portions of the first region separation pattern extends from one side of a central portion of the first photoelectric conversion unit and the second photoelectric conversion unit to another side of the central portion of the first photoelectric conversion unit and the second photoelectric conversion unit in the plan view, wherein the four portions include a first-first portion being parallel to the first direction and a second portion being parallel to the second direction, and wherein the first region separation pattern has a first part directly connected to the first-first portion in the plan view.

13. The image sensor of claim 12, wherein the distance from the first surface of the substrate to the bottom surface of the first region separation pattern is longer than a distance from the first surface of the substrate to a center point between the top surface of the first photoelectric conversion unit and the bottom surface of the first photoelectric conversion unit.

14. The image sensor of claim 13, wherein a length of the first region separation pattern in a third direction from the first surface of the substrate to the second surface of the substrate is shorter than a length of the substrate from the first surface of the substrate to the second surface of the substrate.

15. The image sensor of claim 14, wherein the first region separation pattern has a zigzag shape.

16. The image sensor of claim 15, wherein the first region separation pattern is spaced apart from the second surface of the substrate.

17. An image sensor comprising:
a substrate including a first surface and a second surface opposite to the first surface;
a first unit pixel including a first photoelectric conversion unit and a second photoelectric conversion unit;
a second unit pixel including a third photoelectric conversion unit and a fourth photoelectric conversion unit;
a first microlens on the first and second photoelectric conversion units;
a second microlens on the third and fourth photoelectric conversion units;
a pixel separation pattern surrounding the first unit pixel, wherein the pixel separation pattern extending into the substrate;
a first region separation pattern extending into the substrate between the first photoelectric conversion unit and the second photoelectric conversion unit; and
a second region separation pattern extending into the substrate between the third photoelectric conversion unit and the fourth photoelectric conversion unit,
wherein the first to fourth photoelectric conversion units are sequentially arranged in a first direction in a plan view,
wherein each of the first and second region separation patterns is not a straight line shape and includes two portions, each of the two portions of each of the first and second region separation patterns is not parallel to the first direction and a second direction perpendicular to the first direction in the plan view, wherein the two portions overlap each other in the second direction, and the first and second region separation patterns do not include a line shape extending parallel to either of the first direction or the second direction,
wherein the pixel separation pattern includes four portions and two portions out of the four portions are parallel to the second direction in the plan view,
wherein the first photoelectric conversion unit has a top surface near the first surface of the substrate and a bottom surface near the second surface of the substrate,
wherein the first region separation pattern has a bottom surface near the second surface of the substrate,
wherein a distance from the first surface of the substrate to the bottom surface of the first region separation pattern is longer than a distance from the first surface of the substrate to the top surface of the first photoelectric conversion unit,
wherein the first region separation pattern has a zigzag shape,
wherein one of the two portions of the first region separation pattern extends from one side of a central portion of the first photoelectric conversion unit and the second photoelectric conversion unit to another side of the central portion of the first photoelectric conversion unit and the second photoelectric conversion unit in the plan view,
wherein the four portions include a first-first portion being parallel to the first direction and a second portion being parallel to the second direction, and
wherein the first region separation pattern has a first part directly connected to the first-first portion in the plan view.

18. The image sensor of claim 17, wherein a shape of the first region separation pattern and a shape of the second region separation pattern are same in the plan view.

19. The image sensor of claim 18, wherein the shape of the first region separation pattern is symmetrical with the shape of the second region separation pattern in the plan view.

* * * * *